(12) United States Patent
Daniell

(10) Patent No.: US 7,046,854 B2
(45) Date of Patent: May 16, 2006

(54) SIGNAL PROCESSING SUBBAND CODER ARCHITECTURE

(75) Inventor: Cindy Daniell, Pasadena, CA (US)

(73) Assignee: HRL Laboratories, LLC, Malibu, CA (US)

( * ) Notice: Subject to any disclaimer, the term of this patent is extended or adjusted under 35 U.S.C. 154(b) by 566 days.

(21) Appl. No.: 10/141,498

(22) Filed: May 7, 2002

(65) Prior Publication Data

US 2003/0076888 A1    Apr. 24, 2003

Related U.S. Application Data

(60) Provisional application No. 60/289,608, filed on May 7, 2001, provisional application No. 60/289,349, filed on May 7, 2001, provisional application No. 60/289,408, filed on May 7, 2001.

(51) Int. Cl.
*G06K 9/36* (2006.01)
*G06K 9/46* (2006.01)

(52) U.S. Cl. .................. 382/235; 382/240; 382/260; 708/300

(58) Field of Classification Search ........... 382/235, 382/250, 260, 240, 278; 708/300, 313
See application file for complete search history.

(56) References Cited

U.S. PATENT DOCUMENTS

| | | | |
|---|---|---|---|
| 4,956,871 A | | 9/1990 | Swaminathan |
| 5,216,719 A | * | 6/1993 | Oh .................... 375/240.11 |
| 5,384,869 A | * | 1/1995 | Wilkinson et al. ........ 382/240 |
| 5,446,495 A | | 8/1995 | Diascom et al. |
| 5,453,945 A | * | 9/1995 | Tucker et al. ............. 708/400 |
| 5,481,269 A | | 1/1996 | Imhoff et al. |
| 5,740,036 A | | 4/1998 | Ahuja et al. |
| 5,748,786 A | | 5/1998 | Allen et al. |
| 5,798,795 A | | 8/1998 | Guedini et al. |
| 5,799,112 A | * | 8/1998 | de Queiroz et al. ........ 382/254 |
| 5,848,193 A | | 12/1998 | Garcia |
| 5,867,598 A | | 2/1999 | de Queiroz |
| 5,933,546 A | | 8/1999 | Stone |
| 5,974,186 A | * | 10/1999 | Smith et al. .............. 382/240 |
| 6,064,768 A | | 5/2000 | Hajj et al. |
| 6,173,275 B1 | | 1/2001 | Caid et al. |
| 6,426,983 B1 | * | 7/2002 | Rakib et al. .............. 375/346 |
| 6,553,396 B1 | * | 4/2003 | Fukuhara et al. .......... 708/313 |
| 6,643,406 B1 | * | 11/2003 | Hajjahmad et al. ........ 382/240 |

FOREIGN PATENT DOCUMENTS

WO         0109760         2/2001

* cited by examiner

*Primary Examiner*—Kanjibhai Patel
*Assistant Examiner*—Manav Seth
(74) *Attorney, Agent, or Firm*—Tope-McKay & Associates

(57) ABSTRACT

A method, apparatus, and computer program product for combining a subband decomposition and a linear signal processing filter (LSPF). Operations performed include merging the LSPF, via superposition, with each synthesis filter of the first level of the subband decomposition into a set of composite filters; generating an equivalent structure for the low-pass composite filter and its adjacent upsampler to allow combining the equivalent structure with the synthesis filter on the next level of the subband decomposition; repeatedly operating the merging on the next level of the subband decomposition; creating an equivalent structure for the intermediate structure generated by the merging step and its adjacent upsampler in order to allow for combination of the equivalent structure with the at least one synthesis filter on the next level; repeating the operations for each remaining level to generate a composite subband synthesis linear operator, which operates directly on data of the subband decomposition.

21 Claims, 17 Drawing Sheets

(a) Level One
(b) Level Two
(c) Level Three

SIGNAL PROCESSING SUBBAND CODER ARCHITECTURE

PRIORITY CLAIM

This application claims the benefit of priority to the following provisional applications; 60/289,608, titled Joint Filter Optimization for Signal Processing Subband Coder Architecture filed with the United States Patent and Trademark Office on May 7, 2001; and 60/289,349, titled Signal Processing Subband Code Architecture, filed with the United States Patent and Trademark Office on May 7, 2001; and 60/289,408, titled Object Recognition in Compressed Imagery, filed with the United States Patent and Trademark Office on May 7, 2001.

BACKGROUND OF THE INVENTION (1) Technical Field

The present invention relates to techniques for signal processing. More specifically, the present invention relates to the performance of linear signal processing operations on data stored in a transformed (e.g. compressed) state without the need to transform the data out of the transformed state.

(2) Discussion

Data filtering or mapping techniques have been used for many years in the field of signal processing. Filters are used in a wide variety of applications, such as image processing, pattern recognition, noise reduction, data manipulation, data compression, and data encryption. Many of these filters can be used in conjunction with one another, e.g., for performing multiple functions such as pattern recognition and encryption at the same time.

In file compression, previously a signal had to be brought out of the transform (i.e., compressed) domain and reconstructed prior to any linear signal processing operation. To date, there has been no universal technique for performing linear filtering operations directly on a data in a transform domain (e.g. a multiresolution subband decomposition) without first inverse-transforming the data. Thus, signals or data on which an operation is to be performed must first be reconstructed prior to performing a linear filtering operation.

It is therefore desirable to provide a mechanism by which transformed data may be manipulated without the need for inverse-transforming the data first. Such a system would allow for a variety of linear operations to be performed on transformed data such as compressed images and data, as well as for searching through large databases of compressed data without the need for computationally expensive decompression and recompression.

SUMMARY OF THE INVENTION

The present invention provides method, apparatus, and computer program product embodiments for combining a subband decomposition and a linear signal processing filter, where the subband decomposition comprises N-levels, with each level comprises at least two synthesis filters and an adjacent upsampler, and where each synthesis filter includes a low-pass composite filter and at least one upper-subband filter with a high-pass component. Operations performed include (a) merging the linear signal processing filter, via superposition, with each synthesis filter of the first level of the subband decomposition into a set of composite filters; (b) generating, via an identity formulation, an equivalent structure for the low-pass composite filter and its adjacent upsampler to allow for combination of the equivalent structure with the synthesis filter on the next level of the subband decomposition; (c) repeatedly operating the means for merging on the next level of the subband decomposition; (d) creating, via an inverse form of the identity formulation, an equivalent structure for the intermediate structure generated by the merging step and its adjacent upsampler in order to allow for combination of the equivalent structure with the at least one synthesis filter on the next level; and (e) repeatedly operating the generating means (b), the repeating means (c), and the creating means (d) for each remaining level in the subband decomposition to generate a composite subband synthesis linear operator; whereby the composite subband synthesis linear operator may be used to operate directly on the data represented by the subband decomposition.

In a further embodiment, the subband decomposition is a data compression scheme, whereby the composite subband synthesis linear operator allows for processing data directly in the compressed domain without the need for prior decompression.

In a still further embodiment, the linear signal processing filter is selected from a group consisting of correlation filters, noise-reduction filters, encryption filters, and data manipulation filters; and wherein the subband decomposition is selected from a group consisting of compression filters and encryption filters.

Each of the operations of the apparatus discussed above typically corresponds to a software module for performing the function on a computer or a piece of dedicated hardware with instructions "hard-coded" therein. In other embodiments, the means or modules may be incorporated onto a computer readable medium to provide a computer program product. Also, the means discussed above also correspond to steps in a method. Finally, the present invention also comprises a composite filter produced by the method, apparatus, or computer program product of the present invention.

BRIEF DESCRIPTION OF THE DRAWINGS

The objects, features and advantages of the present invention will be apparent from the following detailed descriptions of the preferred embodiment of the invention in conjunction with reference to the following drawings.

Figure 6:
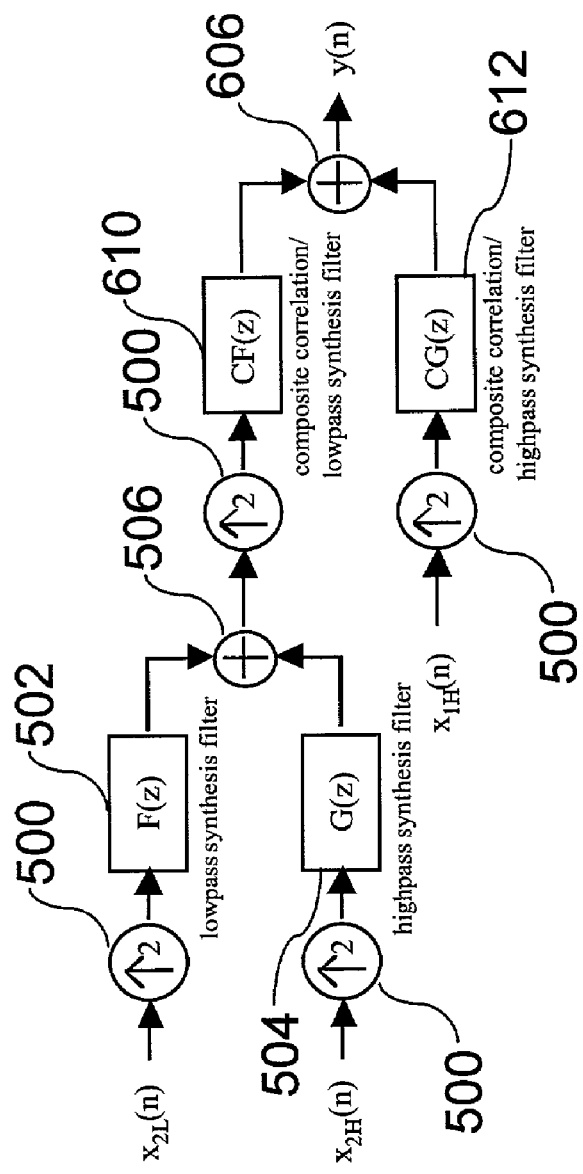
FIG. 6 is a block diagram representation of the reconstruction and recognition portions of a subband synthesis/ correlation filter combination depicted in FIG. 5(b), where the correlation filter has been merged with the first level of the subband synthesis filter via superposition.
Figure 7:
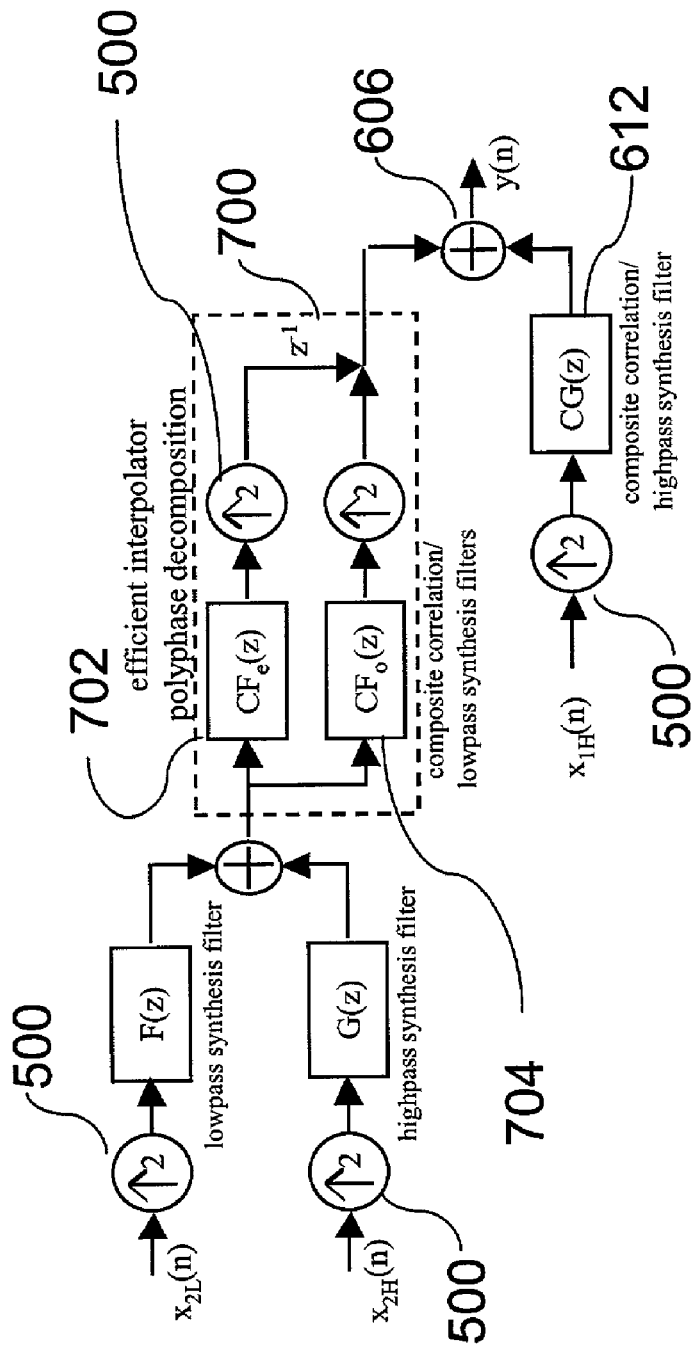
Figure 8:
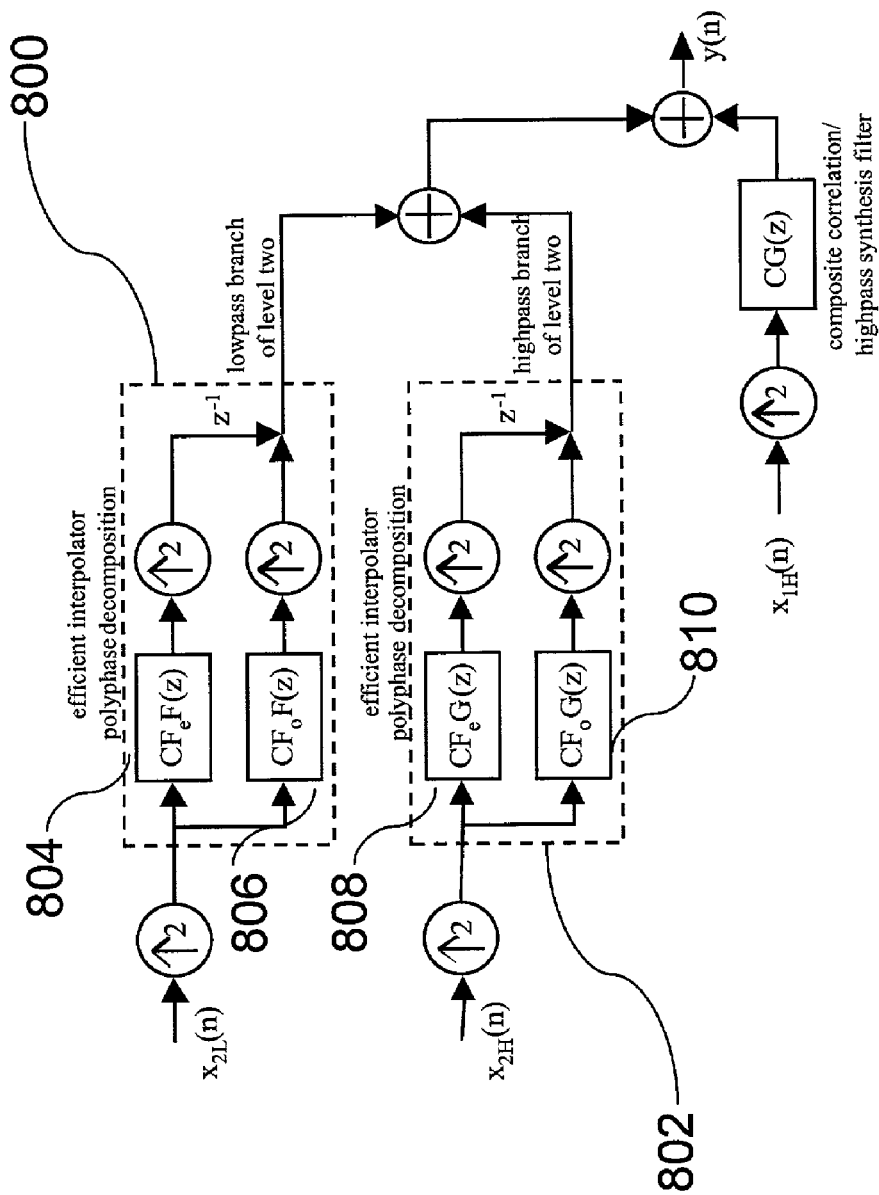
Figure 9:
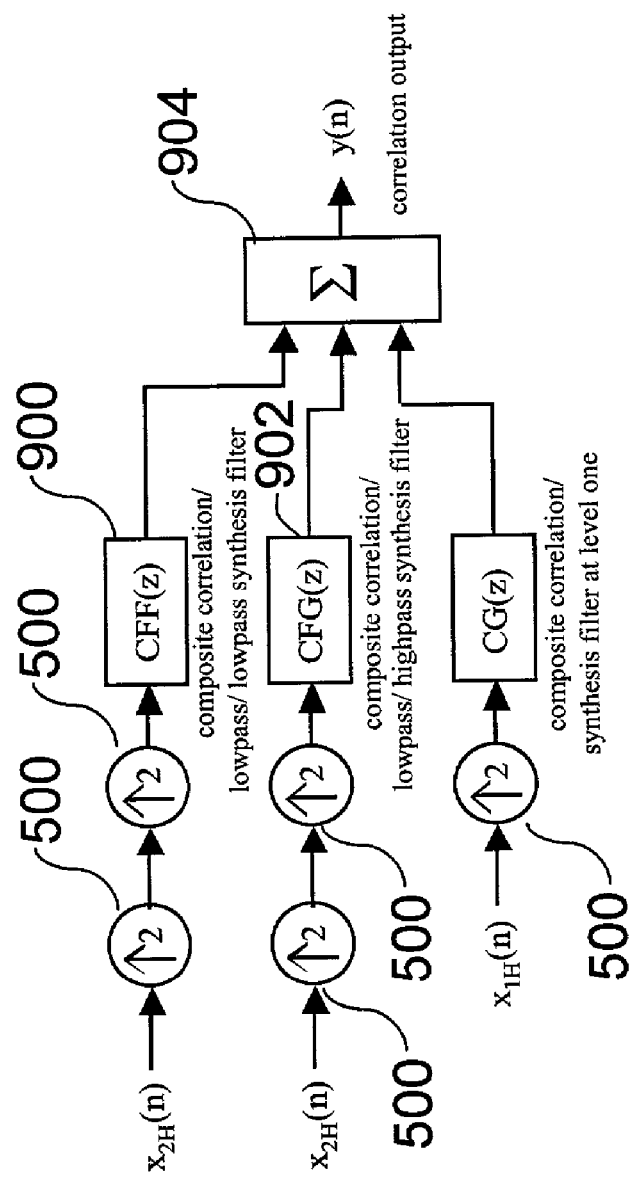
Figure 10:
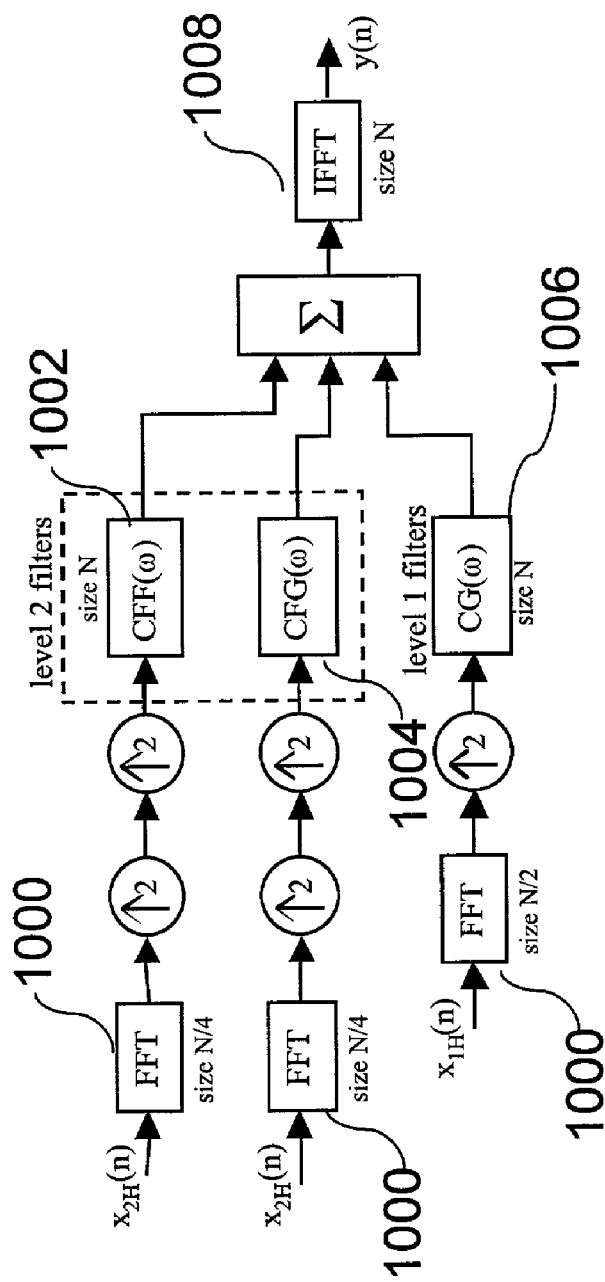
Figure 11:
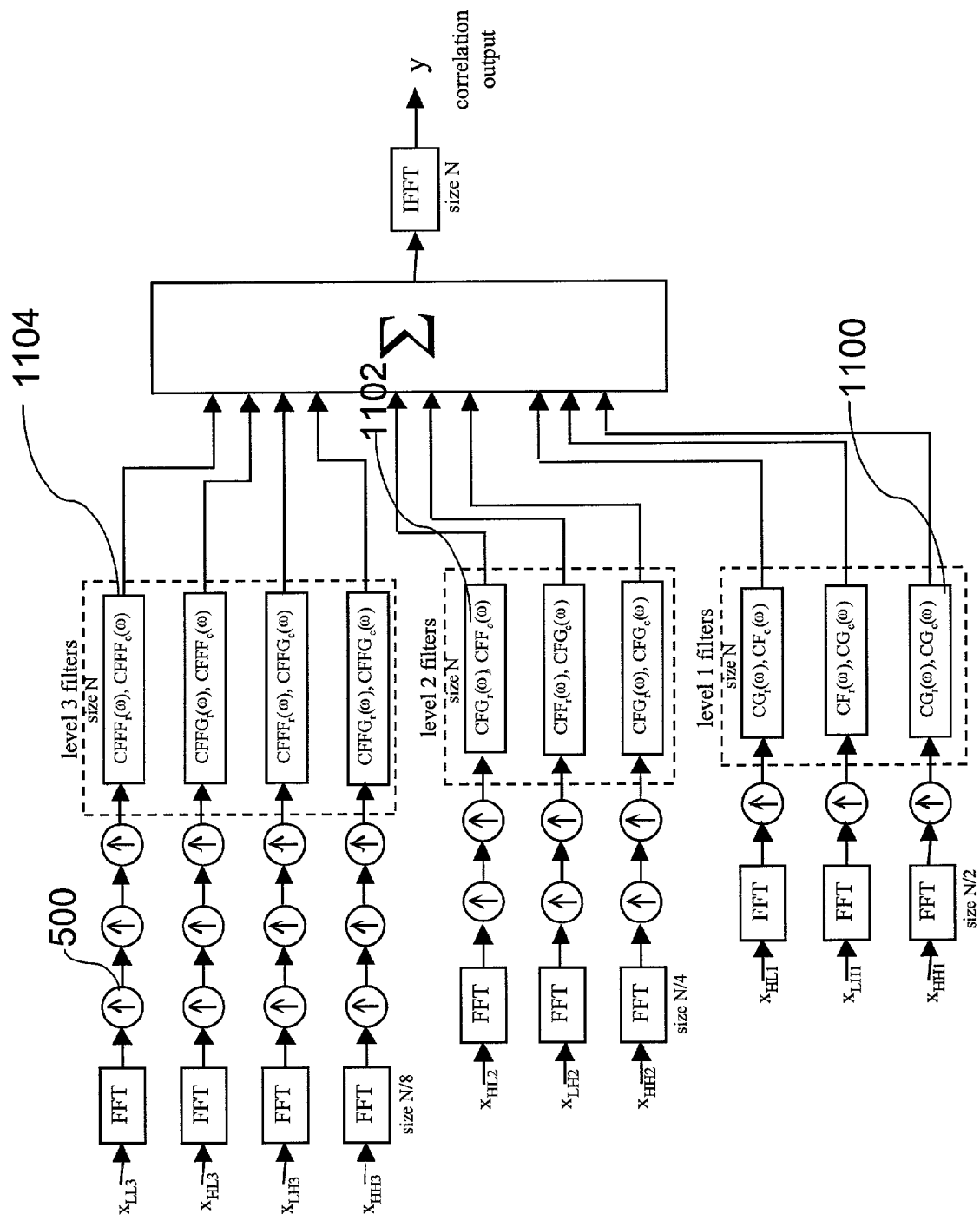
Figure 12:
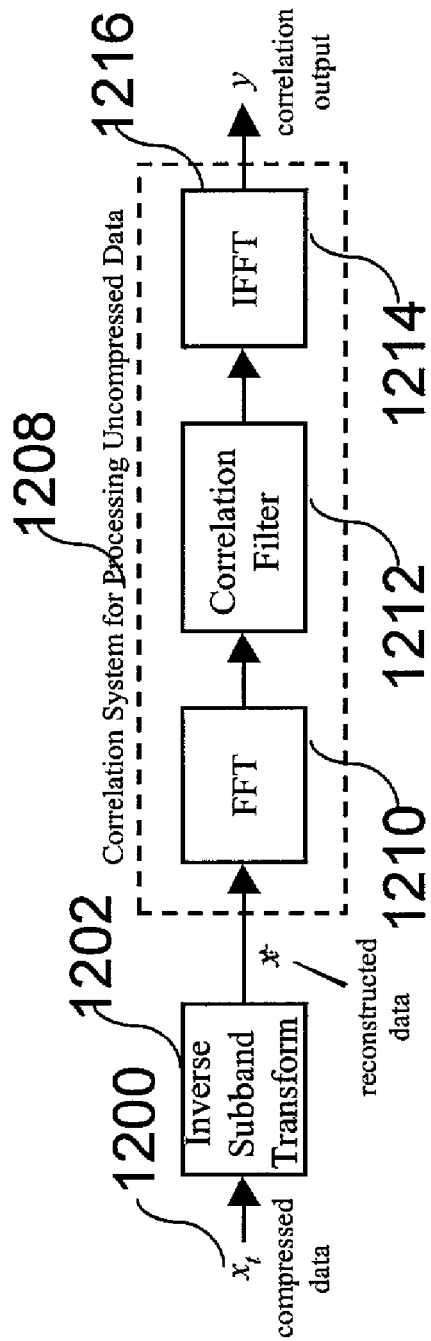
Figure 13:
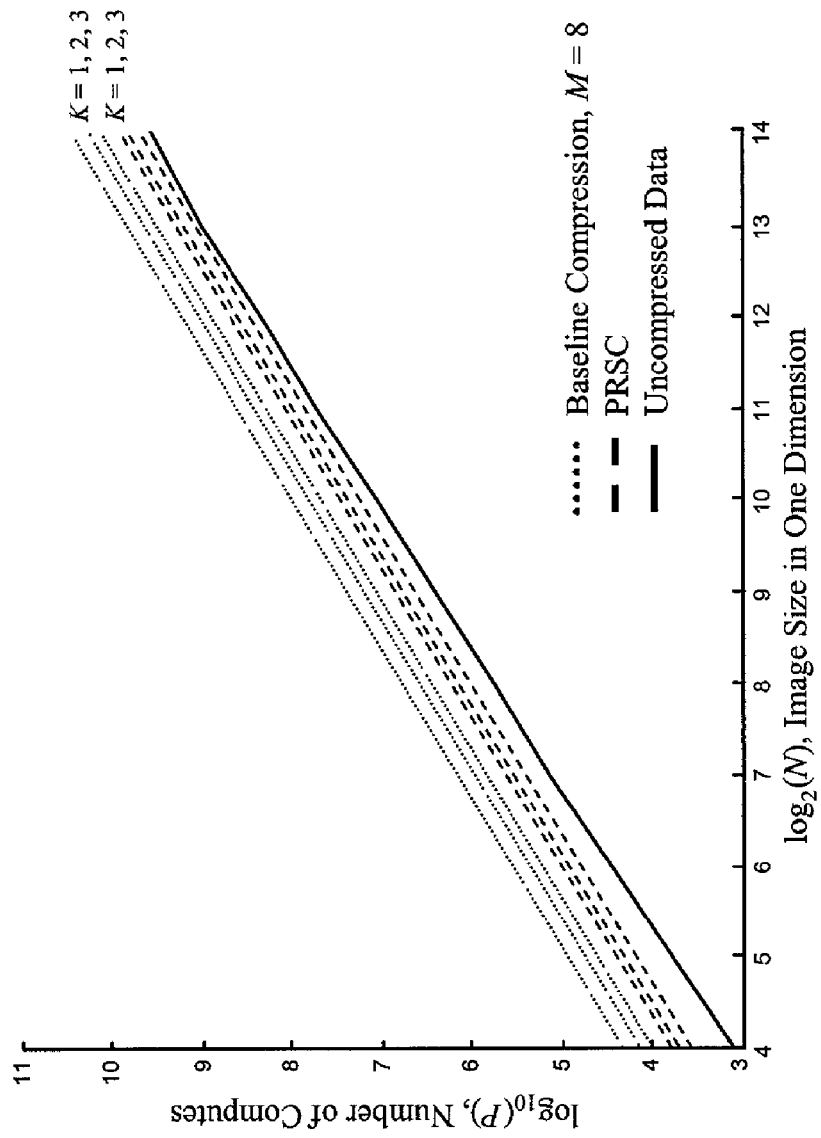
Figure 14:
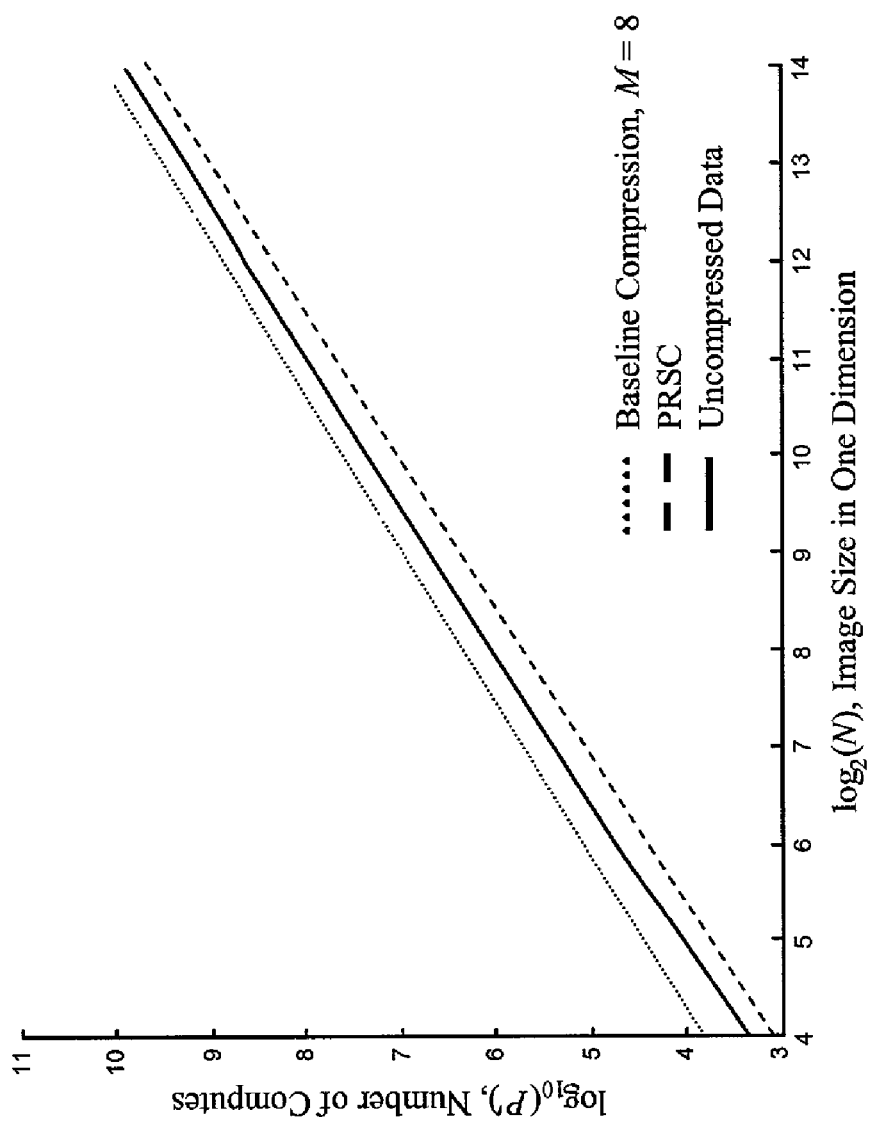
Figure 15:
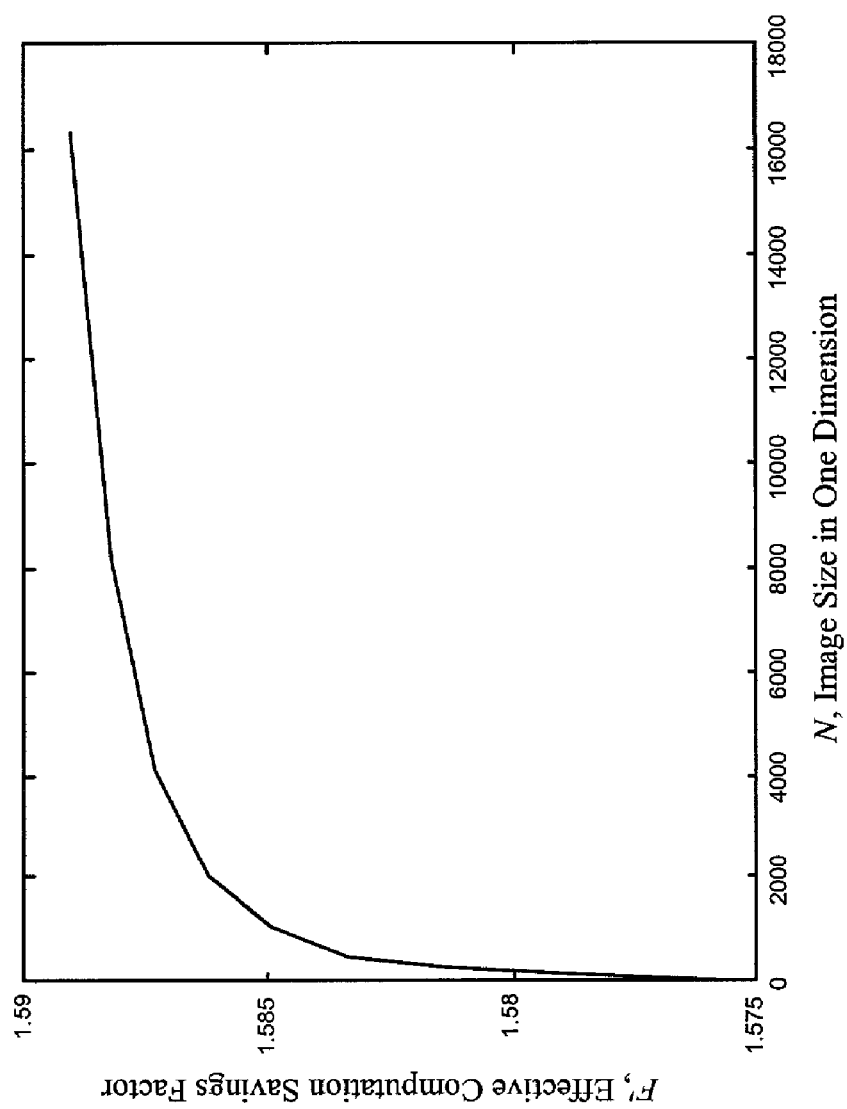
Figure 16:
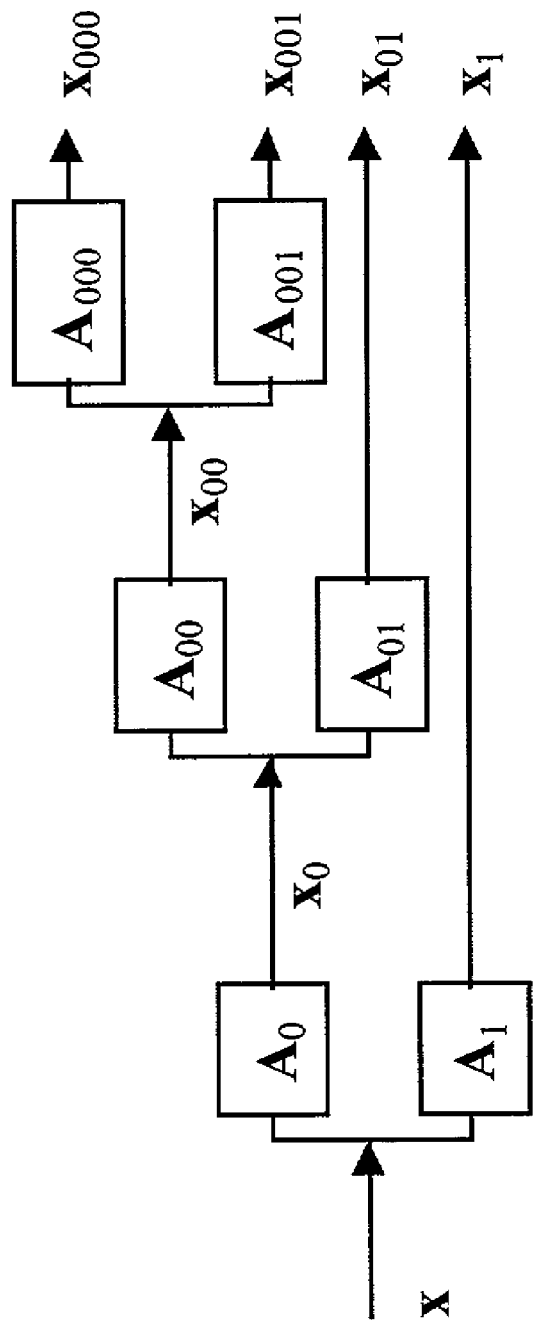
Figure 17:
Figure 17:
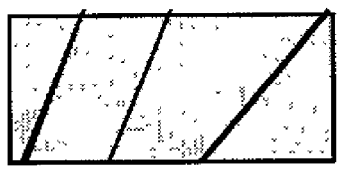

FIG. 7 is a block diagram representation of the reconstruction and recognition portions of the subband synthesis/correlation filter combination depicted in FIG. 6, where the efficient interpolator identity has been employed on the low-pass portion of the first level;

FIG. 8 is a block diagram representation of the reconstruction and recognition portions of the subband synthesis/correlation filter combination depicted in FIG. 7, where the merged correlation/subband filter of level one is merged with the subband filter of the second level;

FIG. 9 is a block diagram representation of the reconstruction and recognition portions of the subband synthesis/correlation filter combination depicted in FIG. 8, where the efficient interpolator identity has been employed again in order to group the upsamplers to the left of the combined filters;

FIG. 10 is a block diagram representation of the reconstruction and recognition portions of the subband synthesis/correlation filter combination depicted in FIG. 9, where the input signal is Fourier transformed so that the combined filter system operates in the frequency domain for ease of processing, and where the output signal is inverse-Fourier transformed into the time domain;

FIG. 11 is a block diagram representation of the reconstruction and recognition process for a one-dimensional, three-level signal to demonstrate the further expansion of the technique of the present invention;

FIG. 12 is a block diagram representation of a baseline subband decomposition/correlation filter used for a result comparison with the system of the present invention;

FIG. 13 is a comparative graph of the number of computes required versus image size in one dimension for varying values of K for the correlation and subband operations of the baseline system and the present invention the correlation operation on uncompressed data;

FIG. 14 is a comparative graph as depicted in FIG. 13 for a single value of K;

FIG. 15 is a comparative graph as depicted in FIG. 13 for large values of N;

FIG. 16 is a block diagram depicting a three-level dyadic decomposition of a one-dimensional signal;

FIG. 17(a) is a depiction of a one level T matrix created from a four tap filter;

FIG. 17(b) is a depiction of a two-level T matrix created from a four tap filter; and FIG. 17(c) is a depiction of a three-level T matrix created from a four tap filter.

DETAILED DESCRIPTION OF PREFERRED EMBODIMENTS

The present invention relates to techniques for signal processing. More specifically, the present invention relates to the performance of linear signal processing operations on data stored in a transformed (e.g. compressed) state without the need to transform the data out of the transformed state. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein, may be applied to a wide range of embodiments. Thus, the present invention is not intended to be limited to the embodiments presented, but is to be accorded the widest scope consistent with the principles and novel features disclosed herein. Furthermore, it should be noted that, unless explicitly stated otherwise, the figures included herein are illustrated diagrammatically and without any specific scale, as they are provided as qualitative illustrations of the concept of the present invention.

The present invention may be applied, for example, to the manipulation of material in large databases. It may also be used in the manipulation of data that must be compressed because it is transmitted over a limited bandwidth. The joint optimization technique specified by this patent can also be used to perform linear signal processing operations on stored data. A few other, non-limiting examples of applications of the present invention include remote sensing and image exploitation; signal classification; object detection and collision avoidance in vehicles; occupant sensing in vehicles; pedestrian detection; and in image architecture designs.

In order to provide a working frame of reference, first a glossary of terms used in the description and claims is given as a central resource for the reader. Next, a discussion of various physical embodiments of the present invention is provided. Finally, a discussion is provided to give an understanding of the specific details.

(1) Glossary

Before describing the specific details of the present invention, a centralized location is provided in which various terms used herein and in the claims are defined. The glossary provided is intended to provide the reader with a general understanding of the intended meaning of the terms, but is not intended to convey the entire scope of each term. Rather, the glossary is intended to supplement the rest of the specification in more accurately explaining the terms used.

Data Compression Scheme—A data compression scheme, as discussed herein, may be any lossy or lossless data compression technique.

Means—The term "means" as used with respect to this invention generally indicates a set of operations to be performed on, or in relation to, a computer. Non-limiting examples of "means" include computer program code (source or object code) and "hard-coded" electronics or dedicated hardware, such as an field programmable gate array (FPGA), digital signal processing (DSP) chip, etc. The "means" may be stored in the memory of a computer or on a computer readable medium, whether on or remote from the computer.

Signal Processing—This term is intended to include its traditional meaning and to apply to areas such as image processing, voice signal processing, as well as data processing.

(2) Physical Embodiments

The present invention has three principal "physical" embodiments. The first is a system for combining subband decomposition and a linear signal processing filter in order to allow for operations directly in the transformed subband domain. The system is typically in the form of a general purpose or dedicated computer system operating software or in the form of a "hard-coded" instruction set. The system allows linear operations to be performed directly without the need for first inverse-transforming the data out of the subband domain. Thus, for example, linear operations such as pattern recognition may be performed directly on subband coded data such as compressed data without the need to first decompress the data. The second physical embodiment is a method, typically in the form of software, operated using a data processing system (computer). Software embodying the a combined subband decomposition and a linear signal processing filter could, for example, be used as a software module along with other software for operations on compressed or encrypted files such as images or text files. The third principal physical embodiment is a computer program product. The computer program product generally represents computer readable code stored on a computer readable medium, such as an optical storage device, e.g., a compact disc (CD) or digital versatile disc (DVD), or a magnetic storage device such as a floppy disk or magnetic tape. Other, non-limiting examples of computer readable media include hard disks, read only memory (ROM), and flash-type memories. These embodiments will be described in more detail below.

Figure 1:
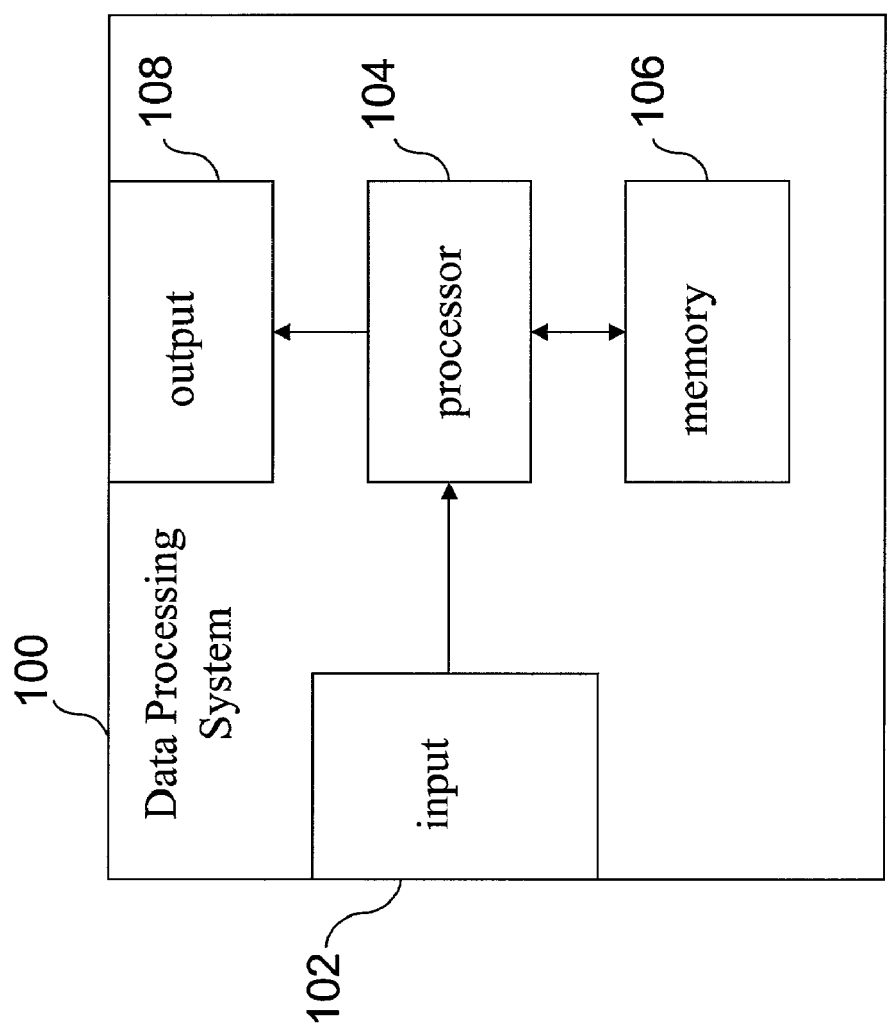
FIG. 1 is a block diagram depicting the components of a computer system used in the present invention.

A block diagram depicting the components of a computer system used in the present invention is provided in FIG. 1. The data processing system 100 comprises an input 102 for receiving information representing a subband decomposition and a linear signal processing filter. The input is connected with a processor 104, which is, in turn, connected with a memory 106. The processor 104 may be a general-purpose computer processor or a specialized processor designed specifically for use with the present invention. The processor is coupled with a memory 106 to permit storage of data and software to be manipulated by commands to the processor. The processor 106 is also coupled with an output 108 to provide output reflective of the operations on the data in the subband domain.

Figure 2:
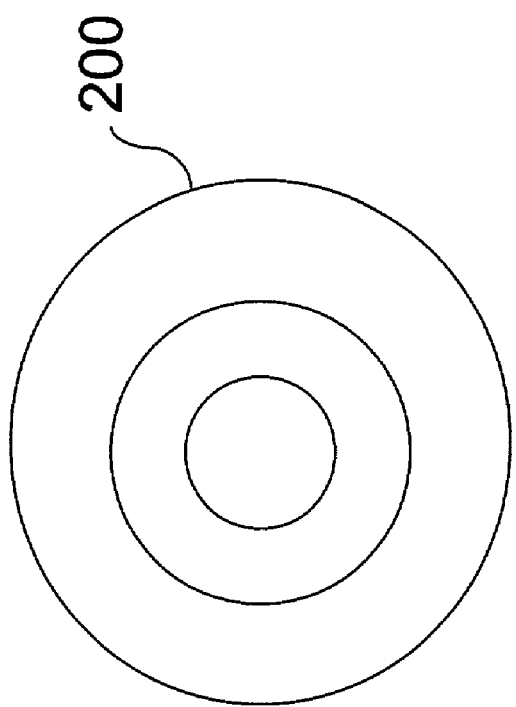
FIG. 2 is an illustrative diagram of a computer program product embodying the present invention.

An illustrative diagram of a computer program product embodying the present invention is depicted in FIG. 2. The computer program product 200 is depicted as an optical disk such as a CD or DVD. However, as mentioned previously, the computer program product generally represents computer readable code stored on any compatible computer readable medium.

(3) Introduction

The present invention provides a signal processing architecture that integrates a linear signal processing filter with subband filters in a homogeneous operation. It allows for linear signal processing within a subband multiresolution decomposition, thus allowing for linear signal processing directly, for example, in the compressed domain (e.g. directly on the multiresolution data of a subband decomposition). The present invention yields several advantages over conventional techniques. In an embodiment geared for use in image processing, for example, it produces a response identical to that produced by the reconstructed image without having to actually perform the reconstruction. Further, it results in a response identical to that affected by the original image, within the fidelity of the subband transform. It is also more computationally efficient than the separate implementation of two filters (i.e. the signal processing linear filter and the subband filter). Additionally, for two-dimensional signals, it provides a faster response than that resulting from the original image by a factor of 1.6, in the limit, as image size approaches infinity.

The number of computes saved by performing the linear and subband filtering together in the signal processing subband coder (SPSC) is dependent on the number of decomposition levels, the length of the subband filter, and the size of the signal. For example, using a correlation filter with a subband filter of length 8 in a 3 level decomposition on a 16,384 square image saves $1.1 \times 10^{10}$ computes, a number equal to 50% of the computes required for operating the two filters independently.

Figure 3:
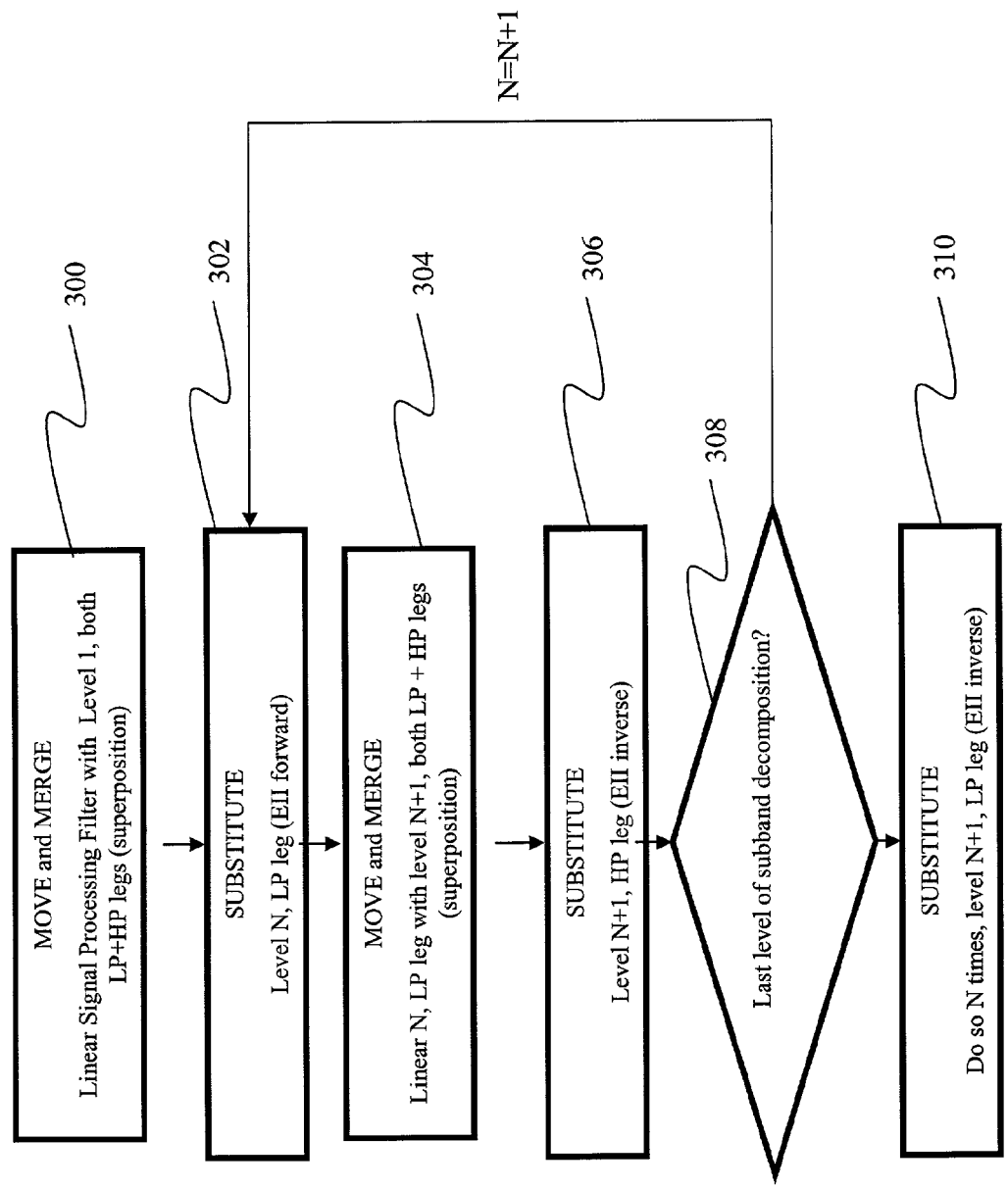
FIG. 3 is a flowchart depicting the steps in a method embodiment of the present invention, with the steps also corresponding to means and modules in an apparatus embodiment.

A flow chart of the processing steps involved in the present invention is depicted in FIG. 3. The general steps are performed to combine a subband decomposition with a linear signal processing filter, where the subband decomposition comprises N-levels. Each of the levels comprises at least two synthesis filters and an adjacent upsampler, and each synthesis level includes a low-pass composite filter and at least one upper-subband filter (e.g. a subband filter with a high-pass component). The processing starts with the merging of the linear signal processing filter, via superposition, with each synthesis filter of the first level N of the subband decomposition (both the low pass and high pass legs) 300. This results in a set of composite filters. Next, using the ideal interpolator identity, an equivalent structure is generated and substituted for the low-pass composite filter and its adjacent upsampler 302. This allows for the combination of the equivalent structure with the synthesis filter on the next level N+1 of the subband decomposition via superposition 304. Thus, the level N low-pass leg is merged with the low-pass and high-pass legs of the next level N+1. Next, an inverse form of the ideal interpolator identity is used to generate and substitute an equivalent structure for the structure generated by the result of the merging operation 304 and its adjacent upsampler, as depicted by block 306, in order to allow for combination of the equivalent structure with at least one synthesis filter on the next level. If there are more levels in the subband decomposition 308 (i.e. this is not the last level of the subband decomposition), the next level N+1 is substituted for the level N and the steps 302, 304, and 306 are repeated. If the last level of the subband decomposition has been reached, an inverse form of the ideal interpolator identity is used to generate and substitute an equivalent structure for the resulting structure at the low pass leg 310 and the process is considered complete. Thus, the composite subband synthesis linear operator may be used to operate directly on the data in the subband decomposition.

The present invention may be used for a wide variety of filter types, some of which include linear signal processing filters such as correlation filters, noise-reduction filters, and data manipulation filters; and subband decompositions such as compression filters and encryption filters. These filters may be used, for example, for the manipulation of material in large databases or the manipulation of data that must be compressed because it is transmitted over a limited bandwidth. The SPSC of the present invention can perform the linear signal processing operations on stored data without having to inverse transform it from the subband domain (e.g. out of its compressed state).

(4) Discussion

In order to provide the reader with a tangible point of reference, the examples herein are discussed in the context of a correlation filter as the linear signal processing filter and a compression filter as the subband decomposition. This particular combination is useful for pattern/object recognition in images. Although these particular filters are chosen for illustrative purposes, the present invention may be used in conjunction with any linear signal processing filter in place of the correlation filter or any subband decomposition. The exact approach as well as the computational complexity will vary from filter to filter, without departing from the scope of the present invention, as can be understood by one of skill in the art. This in mind, the signal processing subband coder (SPSC) architecture of the present invention will always be more computationally efficient than the independent operation of a subband reconstruction and a subsequent linear filter.

This discussion is divided into four sections for clarity. In the first section, background information is provided in the form of a mathematical formulation of a linear system that results in an identical response for both compressed and uncompressed data. This provides basis for a further discussion on the technique for the second section, which elucidates the methodology for merging the subband and correlation (linear) filters. In this section, the SPSC architecture is defined and its construction is explained. The computational efficiency of the SPSC is discussed in the third section. Information regarding the effectiveness and other issues pertaining to the SPSC are discussed in the fourth section.

I. One-Dimensional Formulation

This portion of the description is provided in order to lay the foundation for a more generalized version of the present invention. As mentioned previously, the discussion is provided in the context of a correlation filter and a subband decomposition for data compression. The equation, $$y = Cx \quad (1.1)$$

represents a one-dimensional correlation process in matrix vector notation, where x is a one-dimensional input signal, C is a Toeplitz matrix defined by a one-dimensional correlation filter, and y is the one-dimensional correlation output. Matrix vector notation provides a convenient mathematical and analytical tool for this discussion.

In order to perform the function of the present invention, it is necessary to express the response y in terms of the transformed input, $x_t$. In other words, it is necessary to manipulate the linear system, to achieve an output from a transformed input that is identical to the one produced from its original counterpart. This discussion and the equations depicted herein hold for any linear system; any general transform that can each be written as a matrix operation. It is important to note that although, for purposes of clarity and coherency, this discussion is in the context of correlation processes and compression transforms, it is not limited to these specific applications.

I.a A General Transform Representation

Given a matrix construction of a unitary transform operator, T, Equation (1.1) above may be rewritten as:

$$y = CT^t Tx. \quad (1.2)$$

$x_t$ is defined as the transformed input, $$x_t = Tx, \quad (1.3)$$

$C_t$ as the 'inverse transformed' correlation matrix, $$C_t = CT^t, \text{ and} \quad (1.4)$$

T is the transformation matrix. With these definitions, Equation (1.2) can be restated as the following:

$$y = C_t x_t \quad (1.5)$$

If T is not unitary, the above set of equations remains intact with $T^t$ being replaced by $T^{-1}$, as long as T is nonsingular. It is apparent that if T is a unitary compression transform, then Equation (1.5) provides an elegant method for achieving the correlation surface, y, directly from the compressed image without any reconstruction.

Implementation

The implementation of the technique above for a compression and correlation system will now be discussed. For this discussion, it is assumed that $x_t$ represents compressed images; that T represents the (known) compression transformation matrix; and that the transformed correlation matrix, $C_t$, may be computed a priori and stored off-line.

In order to formulate the transformed correlation matrix, $C_t$, the standard correlation filter must first be produced in the uncompressed domain (along with its matrix counterpart C). This requires the use of uncompressed images. A typical recognition system can complete the training phase a priori at a point when time and processing power are not as limited as during system operation.

If the system specifically calls for a subband transform, the transformation matrix, T, is created directly from the subband analysis filter pair. For clarity, a discussion of the construction of the transform matrix, T, is presented in Section V, the Appendix, below. In brief, the transformation matrix, T, combines the filtering and downsampling of a subband analysis transform over multiple levels in a matrix structure. An informal treatment of the transformation matrix T in the following discussion is intended as a preface to the more detailed material of the Section V, the Appendix, below.

Parallelization

For recursive unitary transforms, an example of which is the subband transform, a unique formulation of Equation (1.5) is defined that lends itself to parallel implementation (note that the present invention may generally be applied to unitary transforms). Using the case of a recursive subband transform, the first level of analysis and synthesis is given by $$x_1 = Tx \text{ and } x = T^t x_1. \quad (1.6)$$

The transformed signal can be separated into its low and high frequency components: $x_1 = [x_{1L} x_{1H}]$. Or, with proper zero padding of the individual vector components, $$x_1 = x_{1L} + x_{1H}. \quad (1.7)$$

Now, adapting T for decreasing vector size, and continuing to split the low frequency band further, the lower levels become $$x_2 = Tx_{1L} \text{ and } x_3 = Tx_{2L}. \quad (1.8)$$

Analogous to Equation (1.7), and with the appropriate zero padding, the lower levels can also be written as a sum of their low and high frequency components as follows:

$$x_2 = x_{2L} + x_{2H} \text{ and } x_3 = x_{3L} + x_{3H}. \quad (1.9)$$

Because the T matrix must decrease in size at every level, however, a subscript, k, is appended (i.e., creating $T_k$) in order to denote the matrix's accommodation of the size of the signal at the $k^{th}$ level. Thus, the appropriate analysis and synthesis equations become:

$$x_1 = T_1 x \; x_2 = T_2 x_{1L} x_3 = T_3 x_{2L} \text{ and} \quad (1.10)$$

$$x = T_1^t x_1 x_{1L} = T_2^t x_2 x_{2L} = T_3^t x_3. \quad (1.11)$$

It is worth noting that in the formal treatment of the matrix T in Section V, the Appendix, below, the matrix will no longer require subscripts, as it will be more formally defined over multiple levels of recursion.

Finally, by writing each level as a sum of its low and high frequency components, and using the appropriate zero padding on the signals at levels one and two, the synthesis of the original signal, x, is as follows:

$$x = T_1^t [T_2^t [T_3^t x_3 + x_{2H}] + x_{1H}] \quad (1.12)$$
$$= T_1^t T_2^t T_3^t x_3 + T_1^t T_2^t x_{2H} + T_1^t x_{1H}.$$

Now, by again treating the correlation filter as a linear system, Equation (1.5) can be computed in parallel, i.e.

$$y = Cx = CT_1'T_2'T_3'x_3 + CT_1'T_2'x_{2H} + CT_1'x_{1H}. \quad (1.13)$$

After combining all the matrix terms, the above equation becomes $$y = C_{t3}x_3 + C_{t2}x_{2H} + C_{t1}x_{1H}, \quad (1.14)$$

where $C_{tk}$ is the appropriate combination of correlation and transform matrices for level k, and the signals at levels one and two still carry the appropriate zero padding. Equation (1.14) can also be viewed as:

$$y = y_3 + y_2 + y_1 \quad (1.15)$$

where $y_k$ is the correlation output surface for level k.

By nesting the recursion (Equation 1.12), a parallel implementation is manifested as clearly elucidated in Equation (1.14). This equation can be helpful in the implementation of one-dimensional linear systems in the transformed domain. The formal treatment here is one possible mathematical expression of the new signal processing architecture, which is introduced further below in section II.

I.b Extension to Two Dimensions

While the implementation of Equation (1.2) is straightforward in one dimension, this is not always quite as straightforward for two dimensions. It is uncomplicated in two dimensions when both the transform, T, and the linear operator, C, are separable. For ease of explanation, the subband compression transform, used herein is separable, and therefore can be written as $T_{row}$ for the row operations and $T_{col}$ for the column processing.

The correlation operation, on the other hand, is not separable. It becomes cumbersome to use Equation (1.2) when searching for two-dimensional patterns in the input signal. It is natural to use a Toeplitz matrix (C in Equation (1.2)) to implement convolution of a one-dimensional signal. However, determining the equivalent structure necessary to perform convolution of a two-dimensional signal is not as easy. While tractable mathematically and algorithmically, the resulting matrix is impractical and computationally expensive. When processing uncompressed imagery, correlation filters avoid the issue completely by not utilizing a matrix implementation, but rather operating in the frequency domain. Thus, another structure must be used in order to operate two-dimensionally in the compressed domain and execute an 'inverse transformed' correlation filter.

II. Merging the Interpolation and Correlation Filters

To provide an alternative method of implementing an 'inverse transformed' correlation filter, polyphase structures are useful, allowing manipulation of the correlation filter and allowing its operation within the inverse transform, i.e., the interpolation filters, of the individual subbands within a subband coder.

II.a. Polyphase Structures

Fundamental to many signal processing applications is the polyphase decomposition the basic equations, which are reviewed here for purposes of clarification.

Consider a transfer function, H(z), which represents a digital filter.

$$H(z) = \sum_{n=-\infty}^{\infty} h(n)z^{-n} \quad (2.1)$$

A polyphase decomposition is simply a way of splitting a filter into its even and odd components as illustrated by Equation (2.2).

$$H(z) = H_e(z^2) + z^{-1}H_o(z^2) \quad (2.2)$$

with $$H_e(z) = \sum_{n=-\infty}^{\infty} h(2n)z^{-n}, \text{ and } H_o(z) = \sum_{n=-\infty}^{\infty} h(2n+1)z^{-n} \quad (2.3)$$

Also useful for the present invention is the noble identity for interpolators, which is graphically depicted in FIG. 4(a), in which the order of a filter G(z) 400 and a an L-level upsampler 402 are reversed such that the L-Level upsampler 402 is "behind" a redefined filter $G(z^L)$ 404, the construct on the right hand side is known as a standard interpolator, which is also shown in FIG. 4(b).

Figure 4:
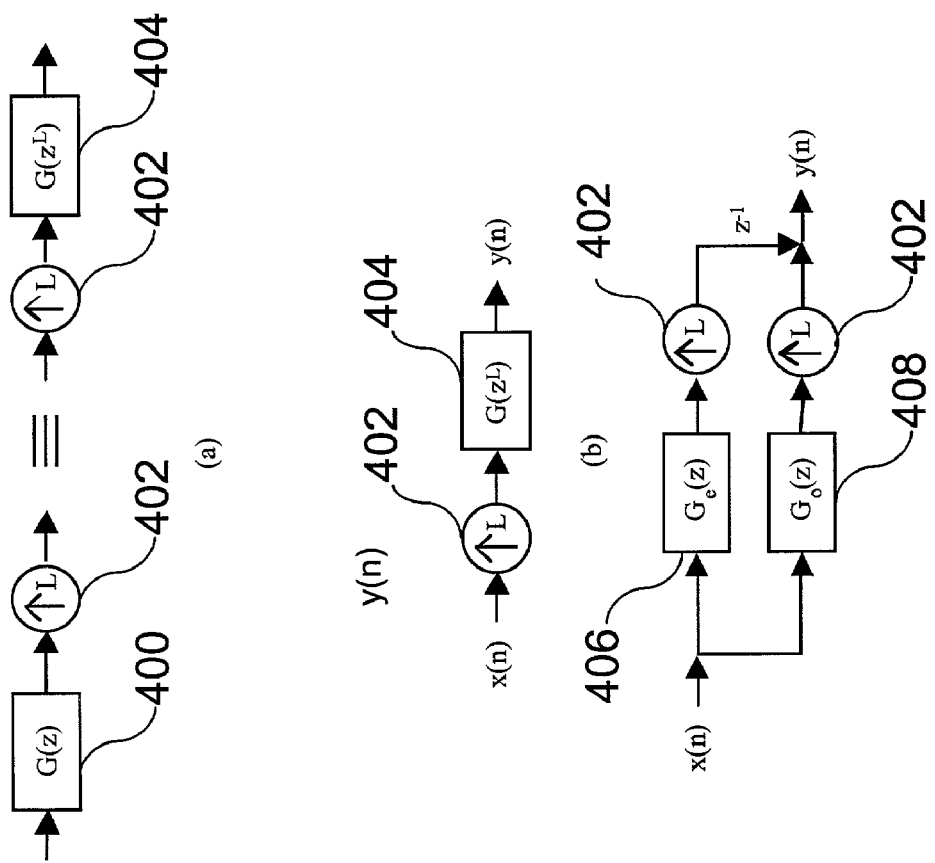
FIG. 4(a) is a block diagram representation of the noble identity for interpolators.
FIG. 4(b) is a block diagram representation of a standard interpolation filter.
FIG. 4(c) is a block diagram representation of the efficient interpolator counterpart of the standard interpolation filter depicted in FIG. 4(b)

Combining the polyphase decomposition with the above noble identity, results in a new construction known as an efficient interpolator, and exhibited for one-dimension in FIG. 4, where FIG. 4(b) portrays a standard interpolation filter, while FIG. 4(c) illustrates its efficient interpolator counterpart. It is called an efficient interpolator because the filters in FIG. 4(c) operate at half the sampling rate as in FIG. 4(b). The efficient interpolator corresponds to a structure similar to that on the left hand side of FIG. 4(a), and includes an even component filter 406 and an odd component filter 408, each of which feed to a respective L-level upsampler 402. Note that the input to the system is presented as x(n), and the output y(n) is arrived at via an inverse z-transform. Both of these structures are equivalent, i.e. either one may replace the other.

Note that the structure of FIG. 4(b) can replace that in FIG. 4(c) and vice-versa. Thus, we say that FIG. 4 illustrates an efficient interpolator 'identity'. The efficient interpolator becomes the architectural building block used to pull the correlation filter from the uncompressed domain into the compressed space, thus dissolving the boundary between the recognition and compression components.

II.b. Rearranging the Architecture

Figure 5:
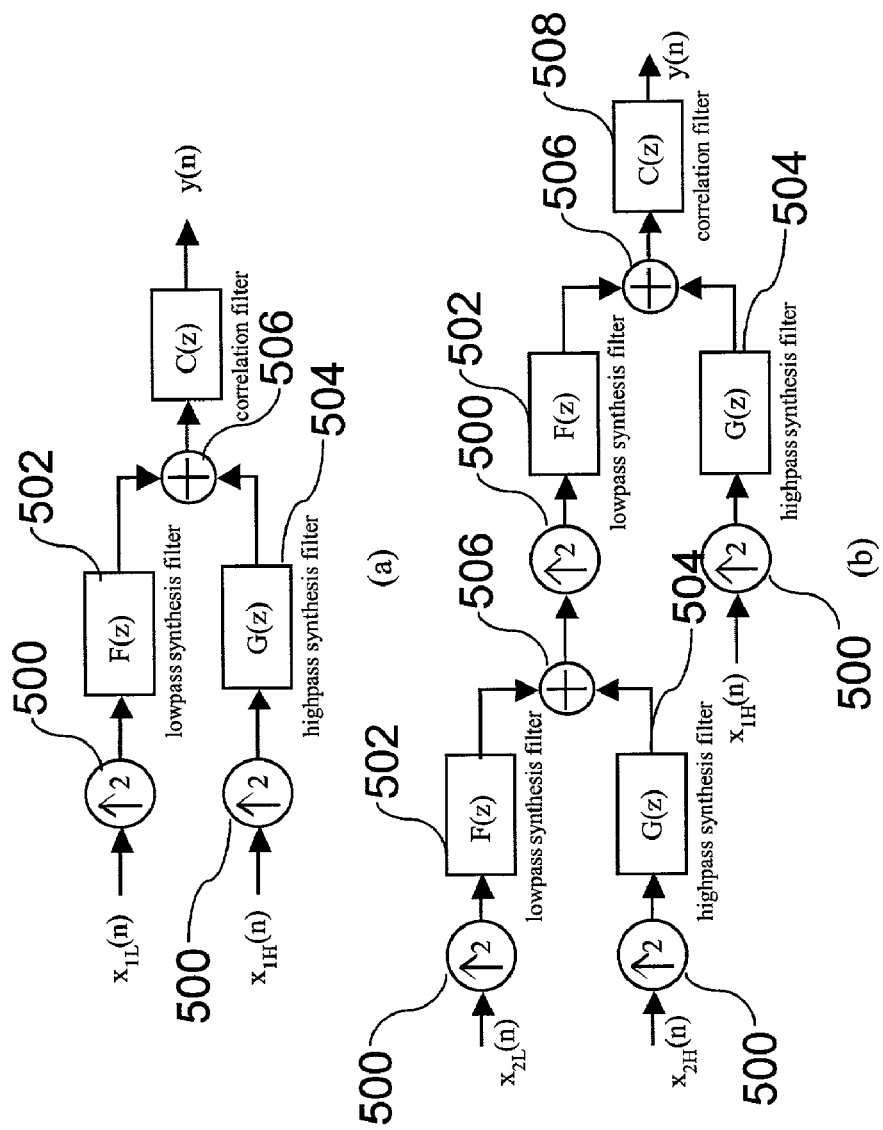
FIG. 5(a) is a block diagram representation of the reconstruction and recognition portions of a subband synthesis/correlation filter combination for a one-dimensional signal/one-level decomposition.
FIG. 5(b) is a block diagram representation of the reconstruction and recognition portions of a subband synthesis/correlation filter combination for a one-dimensional signal/two-level decomposition.

In order to properly introduce this discussion, first, a review of the baseline compression recognition system is presented in the context of image compression. Such a system is defined as one that fully reconstructs an image prior to performing object recognition with the correlation filter. FIG. 5 is a diagram depicting the reconstruction and recognition portions of such a system for a one-dimensional signal with both a one-level and two-level decomposition, represented by FIG. 5(a) and FIG. 5(b), respectively. In this case, all of the upsamplers 500 are 2-level upsamplers. In FIG. 5(a), the input signal is broken into low and high-frequency components, indicated by the L and H subscripts on the input x. The level of the decomposition is indicated by the numeral preceding the L or H subscript, for example, $x_{1L}(n)$ represents the low-frequency components of the first level. Also note that the filter blocks F(z) represent lowpass synthesis filters 502, and the filter blocks G(z) represent highpass synthesis filters 504. Each level of filters are combined using summation blocks 506, with the sum of the components of the higher level summing and being provided to the lowpass synthesis filter 502 of the next lower level, as is shown in FIG. 5(b). At the lowest level, the result of summing is provided to the linear signal processing filter, in this case the correlation filter C(z) 508.

Throughout the ensuing discussion, all filters are represented in their z-Transform notation. For simplicity of notation, as mentioned with respect to FIG. 5, lowpass and highpass synthesis filters are represented as F(z) and G(z), respectively, although traditionally these two filters are denoted as $G_0(z)$ and $G_1(z)$, respectively.

Next, a method of merging the correlation filter, C(z), with the subband synthesis filters is described. In the interest of clarity, without implying any particular limitation, this discussion will be presented in the form of a two level, one-dimensional system. In this case, the rearrangement of the architecture is a four-step process which is illustrated via FIGS. 6 through 9.

Step One: In this step, the correlation filter is moved back into level one of the subband decomposition by using the principle of superposition. The correlation filter, C(z), of FIG. 5(b) can be moved behind the rightmost summation block 606 because addition and correlation are both linear operations. The resulting combined filters for each level are denoted CF(z) 610 and CG(z) 612. Now it is simple to combine the correlation filter with the subband synthesis filters of level one. The new filters are defined in Equation (2.4). The new (resulting) architecture is shown in FIG. 6.

$$CF(z)=C(z)F(z) \quad CG(z)=C(z)G(z) \tag{2.4}$$

Step Two: Before the migration of the recognition filter can continue, the efficient interpolator of FIG. 4 must be employed. It is necessary to use this polyphase structure because the subband synthesis system is a linear time varying system due to the interpolators. The efficient interpolator construction of FIG. 4(c) is used to replace the low frequency leg of level one in FIG. 6, resulting in the diagram of FIG. 7. The dashed line 700 indicates the efficient interpolator polyphase decomposition produced by reversing the order of the filters and the upsamplers, with the blocks $CF_o(z)$ 702 and $CF_e(z)$ 704 represent the odd and even branches of the composite synthesis/recognition filter, CF(z) 610.

Step Three: The above substitution allows the recognition filter to be pushed further back into the subband architecture. The polyphase structure on level one is moved behind the summation at level two, and then the participating filters are combined. Equation (2.5) describes the newly merged filters in a manner similar to Equation (2.4).

$$CF_oF(z)=CF_o(z)\cdot F(z) \quad CF_eF(z)=CF_e(z)\cdot F(z)$$

$$CF_oG(z)=CF_o(z)\cdot G(z) \quad CF_eG(z)=CF_e(z)\cdot G(z) \tag{2.5}$$

The new filters, $CF_oF(z)$, $CF_eF(z)$, $CF_oG(z)$, and $CF_eG(z)$, retain the odd and even structures of the underlying filters $CF_o(z)$ and $CF_e(z)$. Now the architecture consists of two efficient interpolators, one in each branch of the decomposition's second level, as shown in FIG. 8. Thus, the efficient interpolators of level one have been moved back into level two, and the filter operations have been merged. The resulting high and low frequency efficient polyphase decompositions are represented by dashed line blocks 800 and 802, respectively. Thus, the low frequency portion of the first level is combined with the low and high frequency portions of the second level.

Step Four: Finally, to complete the new architecture, the efficient interpolator 'identity' is used. As illustrated in FIG. 4, the efficient interpolator of FIG. 4(c) is equivalent to its single branch counterpart in FIG. 4(b). In this final step such an 'inverse' replacement is made. Additionally, the two summations of the first and second levels are combined, resulting in the parallel construction of FIG. 9. Because the four filters, $CF_oF(z)$ 804, $CF_eF(z)$ 806, $CF_oG(z)$ 808, and $CF_eG(z)$ 810, possess odd and even structures, they may be combined via Equation (2.2) to form filters CFF(z) 900 and CFG(z) 902. Note that all of the upsamplers 500 are moved to the left of the filters, and the summation blocks are combined into a single summer 904. FIG. 9 presents the SPSC architecture for a one-dimensional signal and two decomposition levels. Thus, a single channel interpolator and filter have been substituted for the efficient interpolators of level two. The final architecture consists of only parallel branches of computation. In each branch, the subband synthesis and recognition filters have been combined into one composite synthesis recognition filter.

As mentioned, and as shown in FIG. 9, only parallel branches of computation comprise the SPSC. Each subband of the multiresolution decomposition forms its own distinct branch. Moreover, the composite filters within the SPSC embody a complete union of the compression and recognition domains.

Finally, correlation filters are typically implemented in the frequency domain. In the frequency domain, the correlation filter operation takes the form of a point-to-point multiplication rather than a full convolution. This method greatly speeds up the computation. It is also possible to take advantage of this computational simplicity in the SPSC. Toward this end, a Fast Fourier Transform (FFT) 1000 of each subband's input signal is used, as shown in FIG. 10. The upsampling is done in the frequency domain (as a signal replication), and the composite synthesis/recognition subband filters CFF($\omega$) 1002, CFG($\omega$) 1004, and CG($\omega$) 1006 are stored in their frequency domain. Lastly, an Inverse Fast Fourier Transform (IFFT) 1008 of the summation output must be performed in order to produce a correlation surface in the time domain. These details of the implementation are depicted in FIG. 10 to aid in an assessment of the computational efficiency, which will be presented below in Section III. Summarizing, as is typical of signal processing architectures, the SPSC of the present invention is implemented in the frequency domain. The size of the data arrays at each step is shown for each step in FIG. 10, and is represented by N. Note that all of the correlation filters are of size N by N, because the signal is upsampled (replicated in the frequency domain) prior to correlation. The size of each FFT, however, is commensurate with the size of its subband input signal.

II.c. Extension to Two Dimensions

By continuing the above process outlined in Section II.b recursively, the new SPSC architecture shown in FIG. 10 may be employed over any number of decomposition levels. Multiple polyphase branches have to be made for multiple numbers of interpolators, but this process occurs only in the design stage. Operation of the SPSC is a purely parallel process with its filters designed apriori.

FIG. 11 is an extension of this discussion, illustrating the SPSC architecture for a three level decomposition of a two-dimensional signal. In FIG. 11, the naming convention of the composite synthesis/recognition filters follows that outlined in Equations (2.4) and (2.5), except that Fourier notation is used rather than z Transform notation. Note that the level 1 filters 1100, level 2 filters 1102, and level 3 filters 1104 are presented in the same spirit as the filters shown in FIG. 10, and that the number of upsamplers 500 along each path is equal to the level number of the path.

In summary, the SPSC dissolves the boundary between the compression and recognition domains. Within each branch, all of the subband synthesis filters and the recognition filter are combined into one composite synthesis/recognition filter. The result is ten parallel branches of computation. The FFTs are used to enhance computational efficiency.

The result, y(m,n), is the correlation surface which exactly duplicates the one achieved by the baseline compression recognition system. Such a system, albeit for a two level decomposition of a one-dimensional signal, was shown in FIG. 5(c). That is, the process exhibited in FIG. 11 is equivalent to fully reconstructing the two-dimensional image and then performing the correlation filtering operation on the reconstructed signal, x̃(m, n). The SPSC output is also equivalent to the correlation response achieved by operating on the original signal, x(m,n), limited only by the veracity of the subband transform.

In FIG. 11, the size of the operations is displayed again in order to facilitate an assessment of the computational expense, as reviewed in the following section.

III. Computational Complexity

In this section the computational requirements are compared for three systems: 1) the new SPSC architecture, 2) the baseline compression recognition system, and 3) correlation on uncompressed images. Here, only multiplication operations are considered in assessing the computational complexity of these systems. Some of the operations in the first two systems can be parallelized. Thus, not only the total computation required is examined, but also the maximum number of computes necessary to arrive at an output. The latter is termed the 'effective computation' herein.

III.a. Total Computation

Baseline System and Uncompressed Case

First, the computation involved for performing correlation on uncompressed images is reviewed, along with the computation involved in the baseline compression recognition system. In both cases, the correlation filter is implemented in the most computationally efficient way, i.e., in the frequency domain. FIG. 12 illustrates the major processing steps of the baseline system. The baseline system considered for comparison operates first by receiving compressed data 1200. Next, the compressed data 1200 is inverse subband transformed 1202 out of the compressed domain into the uncompressed domain as reconstructed data 1204. The correlation system for processing the uncompressed data is represented by the dashed block 1206, in which it is first processed into the frequency domain by a use of a fast Fourier transform 1210. Next, the correlation filter 1212 is operated on the frequency domain data, and the result is inverse-Fourier transformed 1214 to provide correlation output 1216. It is worth noting that the baseline compression recognition system is merely an augmentation of the system for correlation on uncompressed images.

The computation for each step shown in FIG. 12 is now quantified, assuming an original image of size N by N, an inverse (synthesis) subband filter of length M, and a decomposition of K levels. In such a system, the dimension (on one side) of a subband on level k is given by $$\frac{N}{2^k}.$$

First, the inverse subband transform (IST) computation is examined. The computation required for the synthesis filters to interpolate one subband is $$6\left(M\left(\frac{N}{2^k}\right)\right)^2.$$

Therefore, the computation required to reconstruct an image from its compressed state is $$\text{IST Computation} = 4\sum_{k=1}^{K} 6M\left(\frac{N}{2^k}\right)^2 \qquad (3.1)$$

$$= 6MN^2 \sum_{k=1}^{K} 4^{1-k}.$$

Both the FFT and IFFT operations take the same number of computes, as specified in Equation (3.2).

$$\text{FFT Computation} = \text{IFFT Computation} = N^2 \log_2 N \qquad (3.2)$$

Because the filter is implemented in the frequency domain, its operation takes the form of a point-to-point multiplication rather than a full convolution.

$$\text{Correlation Computation} = N^2 \qquad (3.3)$$

Equations (3.1)–(3.3) provide the building blocks for the computation calculations. By adding the appropriate constructs, the following calculations of total computation, P, result for the two systems diagrammed in FIG. 12.

$$\text{No Compression: } P = N^2(2\log_2 N + 1) \qquad (3.4)$$

$$\text{Baseline System: } P = N^2\left(2\log_2 N + 1 + 6M\sum_{k=1}^{K} 4^{1-k}\right) \qquad (3.5)$$

SPSC Architecture

Now the SPSC is examined. The three-level process in FIG. 11 shows multiple parallel branches. Within each branch on level k, there is an FFT of size $$\frac{N}{2^k}.$$

$$\text{Branch FFT Computation} = \left(\frac{N}{2^k}\right)^2 \log_2\left(\frac{N}{2^k}\right) \qquad (3.6)$$

There are three FFTs on all levels but the lowest, where there are four.

$$\text{Total FFT Computation} = \qquad (3.7)$$

$$4\left(\frac{N}{2^K}\right)^2 \log_2\left(\frac{N}{2^K}\right) + 3\sum_{k=1}^{K-1} \left(\frac{N}{2^k}\right)^2 \log_2\left(\frac{N}{2^k}\right)$$

The IFFT computation occurs only at the end, and is of the reconstructed image size, N.

$$\text{IFFT Computation} = N^2 \log_2 N \tag{3.8}$$

Each parallel branch contains a composite synthesis/correlation filter of size N. There are, however, [4+3(K−1)] branches in a SPSC with K decomposition levels. Again, this filter is implemented in the frequency domain, so its operation takes the form of a point-to-point multiplication rather than a full convolution. This filter operation is of size N because it occurs after the upsampling operations.

$$\text{Correlation Computation} = [4+3(K-1)]N^2 \tag{3.9}$$

By adding Equations (3.8)–(3.10), the total computation necessary for the SPSC operation may be written as follows:

$$P = 4\left(\frac{N}{2^K}\right)^2 \log_2\left(\frac{N}{2^K}\right) + \tag{3.10}$$

$$3\sum_{k=1}^{K-1}\left(\frac{N}{2^k}\right)^2 \log_2\left(\frac{N}{2^k}\right) + [4+3(K-1)]N + N^2\log_2 N.$$

After algebraic manipulation and combining of terms, this value becomes $$P = [1+4^{1-K}]N^2\log_2 N + [1+K(3-4^{1-K})]N^2 + \tag{3.11}$$

$$3N^2 \sum_{k=1}^{K-1} 4^{-k}(\log_2 N - k).$$

Summary and Comparisons

The total computation necessary for each system's operation is summarized in the list below.

No Compression: $P = N^2(2\log_2 N + 1)$

Baseline System: $P = N^2\left(2\log_2 N + 1 + 6M\sum_{k=1}^{K} 4^{1-k}\right)$

SPSC: $P = [1+4^{1-K}]N^2\log_2 N + [1+K(3-4^{1-K})]N^2 +$ $$3N^2\sum_{k=1}^{K-1} 4^{-k}(\log_2 N - k)$$

An important observation is that the SPSC computation is not dependent on the value of M, i.e., the length of the subband synthesis filter. This is because the subband synthesis filter is incorporated into the correlation filter prior to the system operation.

FIG. 13 is a graph comparing the total computation expended by each of the three systems for varying values of N. One value for M is selected, and the baseline computation is depicted over several values of K. Likewise, the computation executed by the SPSC is shown for several values of K—note that M is not a factor in this case. As may be seen, the SPSC fares much better than the baseline compression recognition system. Note also that the SPSC computation is not dependent on the length of the subband synthesis filter, M, as is the baseline system. For larger values of M, the baseline computation increases. Both methods of processing compressed images consume more total computation than when working with uncompressed images.

III.b. Effective Computation

Recall that this term is defined to represent the total number of computations required to arrive at a result. By parallelizing some operations, the effective computation can be much lower than the total computation of a system.

SPSC Architecture

For many applications, the speed of computation is more important than the total computation involved. In this regard, the parallelism inherent in the SPSC is beneficial. Operation of the SPSC can be viewed as ten parallel processing steps, with the total processing time dictated by the longest leg (i.e., one of the largest subbands). The largest subband requires an FFT of size $$\frac{N}{2},$$

and a filter operation of size N. Lastly, the final stream of data requires an IFFT of size N. Thus, the effective computation of the SPSC is reflected in the following equation:

$$P' = \left(\frac{N}{2}\right)^2 \log_2\left(\frac{N}{2}\right) + N^2 + N^2\log_2 N \tag{3.12}$$

$$= N^2\left(\frac{1}{4}\log_2 N - \frac{1}{4} + \log_2 N + 1\right)$$

$$= N^2\left(\frac{5}{4}\log_2 N + \frac{3}{4}\right).$$

Baseline System and Uncompressed Case

The inverse subband transform can also be performed in parallel in a manner analogous to the SPSC. Thus, the effective computation of the baseline compression recognition system is contingent upon only one of its largest subbands. The effective computation required to fully reconstruct the image is derived from Equation (3.1) and is given below.

$$\text{Effective IST Computation} = \frac{3}{2}MN^2 \tag{3.13}$$

To the effective computation of the baseline system may be determined with reference to FIG. 12. After adding the effective inverse subband transform value with the number of computations required by the FFT, correlation filter, and IFFT operations (all of size N), the result is Equation (3.14) below.

$$P' = \frac{3}{2}MN^2 + N^2\log_2 N + N^2 + N^2\log_2 N \tag{3.14}$$

$$= N^2\left(2\log_2 N + 1 + \frac{3}{2}M\right)$$

Finally, the standard method of working with uncompressed data is completely serial. Therefore, P=P' and is given below.

$$P' = N^2(2\log_2 N+1) \quad (3.15)$$

Summary and Comparisons

The effective computation necessary for each system's operation is summarized in the following list.

No Compression: $P' = N^2(2\log_2 N+1)$ (3.16)

Baseline System: $P' = N^2\left(2\log_2 N + 1 + \dfrac{3}{2}M\right)$ (3.17)

SPSC: $P' = N^2\left(\dfrac{5}{4}\log_2 N + \dfrac{3}{4}\right)$ (3.18)

It is readily apparent from the list above that the baseline system provides the slowest output response. The most important observation, however, is that the SPSC provides a faster system response than that provided by working with uncompressed imagery. As may be seen by subtracting Equation (3.18) from (3.16), a result faster may be achieved with compressed images than with uncompressed images, by the following number of computations:

$$D' = N^2\left(\dfrac{3}{4}\log_2 N + \dfrac{1}{4}\right). \quad (3.19)$$

For large values of N, this difference can become quite significant as exhibited in FIG. 14, where the effective computation of all three systems is characterized. The computation of the baseline system is plotted for only one value of M; for larger values the computation increases.

Moreover, by taking a ratio of Equation (3.16) and (3.18), the savings factor, F', achieved in the effective computation by using compressed data may be estimated. In the limit, the factor goes to the value of 1.6, and is very close to this value even for small image sizes, as FIG. 15 shows.

Effective Computation Savings Factor: (3.20)

$$F' = \dfrac{8\log_2 N + 4}{5\log_2 N + 3}$$

$$F'_{N\to\infty} = 1.6$$

IV. Summary

The SPSC is a new architecture that may be used, for example, for performing linear signal processing operations directly on compressed image data. It is equivalent to performing the linear filtering on the reconstructed image and has several novel benefits, as outlined below.

It is a universal architecture for operating any linear filter directly on the multiresolution data of a subband coder.

It produces a response identical to that produced by the reconstructed image.

It results in a response identical to the equivalent filtering on the original image, within the fidelity of the subband transform.

It provides a faster response than the equivalent filtering operation on uncompressed data, by a factor of F'=1.6 as N (dimension on one side of a square image) goes to infinity. The factor is very close to 1.6 even for very small N.

It requires less total computation than the baseline compression recognition system. The difference between the two systems grows larger with increasing image size.

It combines the global correlation filter and each subband interpolation filter into one composite filter resulting in a new correlation filtering technique for recognizing patterns in compressed imagery.

In conclusion, subband coders afford the image and signal processing world with effective compression, encryption, and other functionalities. The SPSC architecture of the present invention provides more than correlation within a subband coder; it also offers a technique for linear filtering in the subband transform domain. Thus, any signal and image processing operation (non-limiting examples of which include boundary detection, segmentation, feature extraction, and feature description) that can be written as a linear filter (in other words, any linear signal processing filter), can be performed in the transform domain with no loss of information, within the fidelity of the subband transform. This allows the introduction of quantization, and hence, compression. Thus, the SPSC brings signal processing one step closer to operating directly on compressed imagery.

V. Appendix—Matrix Formulation of a Subband Decomposition

This Appendix is provided for clarity and to assist the reader in understanding the concepts presented herein. A review of Equations (1.2)–(1.4) suggests that it would be helpful to formulate the subband transforms in matrix representations. Section I, above, briefly introduced this construction; a more formal treatment is presented here. In Section I, the T matrix was discussed for the purpose of a single recursion level. Now, the more general case of multiple recursion levels is presented. The formulation presented here evolved from the work of Mahalanobis, et. al., (A. Mahalanobis, S. Song, M. Petragalia and S. K. Mitra, "Adaptive FIR Filters Based on Structural Subband Decomposition for System Identification Problems," *IEEE Trans. on Circ. and Sys.*, 40, pp. 354–362, June 1993), which may be consulted for further background.

Central to the following discussion is the fact that the matrix representation developed here combines the filtering and downsampling of a subband analysis transform over multiple levels in a matrix structure. In the interest of clarity, the discussion is limited to the one-dimensional case, though the same discussion could readily be expanded to multi-dimensional cases by one of skill in the art.

To start, let $x=[x(0)x(1)\ldots x(L-1)]$ be a vector of length L which contains the samples of the signal $x(n)$. For simplicity, it is assumed that $L=2^M$, where M is any positive integer. It is further assumed that the subband analysis filters $h_o(n)$ and $h_1(n)$ of length N, decompose $x(n)$ into two new subsequences $x_0(n)$ and $x_1(n)$. In matrix-vector notation, the decomposition of x into two subsequences $x_0$ and $x_1$ of length (L+N−2)/2 can be succinctly expressed as:

$$x_1 = A_1 x$$

$$x_2 = A_2 x' \text{ and} \quad (5.1)$$

$$x = A_1^t x_1 + A_2^t x_2; \quad (5.2)$$

where $A_0$ and $A_1$ are unitary transform matrices of size $(L+N-2)/2$ by $L$. $A_0$ and $A_1$ satisfy the conditions $A_0^t A_0 = I$, $A_1^t A_1 = I$, and $A_0^t A_1 = 0$. These matrices are constructed from the subband analysis filters as follows:

$$A_0 = \begin{bmatrix} h_0(1) & h_0(0) & 0 & 0 & \cdots & \cdots & 0 & 0 \\ h_0(4) & h_0(3) & h_0(1) & h_0(0) & \cdots & \cdots & 0 & 0 \\ \vdots & \vdots & \ddots & \ddots & \ddots & & \vdots & \vdots \\ 0 & 0 & \cdots & \cdots & h_0(N-1) & h_0(N-2) & h_0(N-3) & h_0(N-4) \\ 0 & 0 & \cdots & \cdots & \cdots & 0 & h_0(N-1) & h_0(N-2) \end{bmatrix}$$

$$A_1 = \begin{bmatrix} h_1(1) & h_1(0) & 0 & 0 & \cdots & \cdots & 0 & 0 \\ h_1(4) & h_1(3) & h_1(1) & h_1(0) & \cdots & \cdots & 0 & 0 \\ \vdots & \vdots & \ddots & \ddots & \ddots & & \vdots & \vdots \\ 0 & 0 & \cdots & \cdots & h_1(N-1) & h_1(N-2) & h_1(N-3) & h_1(N-4) \\ 0 & 0 & \cdots & \cdots & \cdots & 0 & h_1(N-1) & h_1(N-2) \end{bmatrix}$$

The rows of $A_0$ and $A_1$ are shifted versions of the subband filters, appropriately padded with zeros to implement the required filtering and decimation. As a result, the matrix-vector multiplication of Equation (5.1) yields the desired filtered and downsampled subband sequences. The relation between the subband sequences and the original signal can also be expressed as:

$$\begin{bmatrix} x_0 \\ x_1 \end{bmatrix} = \begin{bmatrix} A_0 \\ A_1 \end{bmatrix} x = Tx, \quad (5.4)$$

where $$T = \begin{bmatrix} A_0 \\ A_1 \end{bmatrix}$$

may be considered to be a one level decomposition matrix for splitting a signal into two subbands. Because the subband decomposition matrices are unitary, it follows that $T^t T = I$, and $$x = T^t \begin{bmatrix} x_0 \\ x_1 \end{bmatrix}, \quad (5.5)$$

which is the inverse decomposition (i.e., synthesis) equation.

Furthermore, the structure of T can be generalized to represent any one to M band transformation including partial decompositions and the maximally decimated case. Here, the focus of attention is on the structure of T for the case of a dyadic hierarchical decomposition in which only the low frequency signal is recursively decomposed. For example, FIG. 16 diagrams this process for a three level decomposition of the signal x, in which the low frequency signal is recursively decomposed to form a one-dimensional subband decomposition.

The process in FIG. 16 leads to the following set of equations.

$$x_{000} = A_{000} x_{00} = A_{000} A_{00} x_0 = A_{000} A_{00} A_0 x$$

$$x_{001} = A_{001} x_{00} = A_{001} A_{00} x_0 = A_{001} A_{00} A_0 x$$

$$x_{01} = A_{01} x_0 = A_{01} A_0 x$$

$$x_1 = A_1 x \quad (5.6)$$

In the above equations, the symbols '0' and '1' refer to the branch of the dyadic tree being traversed. The number of symbols in the subscripts indicates the stage of the decomposition. Thus, the subscript '001' refers to quantities in the second subband at the third stage of the decomposition process. All the subband decomposition matrices are of the type in Equation (5.3), but are appropriately dimensioned to match the lengths of the input and output signals at each stage. Based on the above formulation, it is now easy to see that the relation between the input signal and the subband output is given by:

$$\begin{bmatrix} x_{000} \\ x_{001} \\ x_{01} \\ x_1 \end{bmatrix} = \begin{bmatrix} A_{000} A_{00} A_0 \\ A_{001} A_{00} A_0 \\ A_{01} A_0 \\ A_1 \end{bmatrix} x = Tx, \text{ where} \quad (5.7)$$

$$T = \begin{bmatrix} A_{000} A_{00} A_0 \\ A_{001} A_{00} A_0 \\ A_{01} A_0 \\ A_1 \end{bmatrix} \quad (5.8)$$

is the three level decomposition matrix that implements the process shown in FIG. 16. Again, because each of the subband decomposition matrices which comprise T are unitary, it follows that $T^t T = I$, and that the expression for synthesis is given by $$x = T^t \begin{bmatrix} x_{000} \\ x_{001} \\ x_{01} \\ x_1 \end{bmatrix}. \quad (5.9)$$

Now, consider the case where the analysis and synthesis filter banks are not unitary or orthogonal, but rather biorthogonal, as is the case with many wavelets. The above equations and discussion still hold, with the exception that the biorthogonal matrix U replaces $T^t$, and $TU = I$. The matrix U is formed in a manner analogous to the way T is formed, except that the submatrices, $A_0$ and $A_1$, are composed from the subband synthesis filters, rather than from the subband analysis filters. In fact, as long as the forward transform is invertible, the matrix formulation T is applicable. (T has to be nonsingular, and thus invertible.) In this case, $T^{-1}$ is formed from the inverse transform filters, rather than the forward transform filters.

For illustration purposes, FIG. 17(a), FIG. 17(b), and FIG. 17(c) portray one, two, and three level T matrices, respectively, created from a four tap filter. Matrix multiplication of the one level T matrix of FIG. 17(a) with an image in both the row and column directions will result in a four-level subband decomposition. Likewise, matrix multiplication of an image in both row and column directions with the three-level T matrix of FIG. 17(c) will result in a three-level subband decomposition.

For further clarity, in FIG. 17(a), the upper and lower diagonal bands represent the low and high-pass subband filters, respectively. The upper two diagonals of FIG. 17(b) represent the low and high-pass filtering process for level two, while the lowest diagonal designates the high-pass operation of level one. Finally, in FIG. 17(c), the upper two diagonals accomplish the low and high-pass filtering operations of level three; the next diagonal band depicts the high-pass level two operation; the lowest diagonal band effects the level one high-pass filtering process. Notice the increased decimation of the diagonal structures for the higher decomposition levels (lower levels of resolution).

In summary, the matrix construct T collapses the complete subband hierarchy into an aggregate structure which provides a direct channel from input to output and vice-versa. Multiplying an input image (in both the row and column direction) with an M level T matrix results in an M level decomposition with (3M+1) bands. Thus, the matrix T provides a single to multiple band relationship.

What is claimed is:

1. A method for combining a subband decomposition and a linear signal processing filter, where the subband decomposition comprises N-levels, with each level comprises at least two synthesis filters and an adjacent upsampler, and where each synthesis filter includes a low-pass composite filter and at least one upper-subband filter with a high-pass component, the method comprising the steps of:
    (a) merging the linear signal processing filter, via superposition, with each synthesis filter of the first level of the subband decomposition into a set of composite filters;
    (b) generating, via an identity formulation, an equivalent structure for the low-pass composite filter and its adjacent upsampler to allow for combination of the equivalent structure with a synthesis filter on the next level of the subband decomposition;
    (c) repeatedly operating the step of merging on the next level of the subband decomposition;
    (d) creating, via an inverse form of the identity formulation, an equivalent structure for the set of composite filters generated by the merging step and its adjacent upsampler in order to allow for combination of the equivalent structure with at least one synthesis filter on the next level;
    (e) repeatedly operating the generating step (b), the repeatedly operating step (c), and the creating step for each remaining level in the subband decomposition to generate a composite subband synthesis linear operator; whereby the composite subband synthesis linear operator may be used to operate directly on the data represented by the subband decomposition.

2. A method for combining a subband decomposition and a linear signal processing filter as set forth in claim 1, wherein the subband decomposition is a data compression scheme, whereby the composite subband synthesis linear operator allows for processing data directly in the compressed domain without the need for prior decompression.

3. A method for combining a subband decomposition and a linear signal processing filter as set forth in claim 2, wherein the linear signal processing filter is selected from a group consisting of correlation filters, noise-reduction filters, encryption filters, and data manipulation filters; and wherein the subband decomposition is selected from a group consisting of compression filters and encryption filters.

4. A combined subband decomposition and linear signal processing filter created by the method of claim 1.

5. A combined subband decomposition and linear signal processing filter created by the method of claim 2.

6. A combined subband decomposition and linear signal processing filter created by the method of claim 3.

7. An apparatus for combining a subband decomposition and a linear signal processing filter, where the subband decomposition comprises N-levels, with each level comprising at least two synthesis filters and an adjacent upsampler, and where each synthesis filter includes a low-pass composite filter and at least one upper-subband filter with a high-pass component, where the apparatus comprising a computer system including a processor, a memory coupled with the processor, an input coupled with the processor for receiving data, and an output coupled with the processor for outputting data, and wherein the computer system further comprises means, residing in its processor and memory, for:
    (a) merging the linear signal processing filter, via superposition, with each synthesis filter of the first level of the subband decomposition into a set of composite filters;
    (b) generating, via an identity formulation, an equivalent structure for the low-pass composite filter and its adjacent upsampler to allow for combination of the equivalent structure with a synthesis filter on the next level of the subband decomposition;
    (c) repeating the operation of the merging means for the next level of the subband decomposition;
    (d) creating, via an inverse form of the identity formulation, an equivalent structure for the set of composite filters generated by the merging step and its adjacent upsampler in order to allow for combination of the equivalent structure with at least one synthesis filter on the next level;
    (e) repeating the generating means (b), the repeating means (c), and the creating means (d) for each remaining level in the subband decomposition to generate a composite subband synthesis linear operator; whereby the composite subband synthesis linear operator may be used to operate directly on the data represented by the subband decomposition.

8. An apparatus for combining a subband decomposition and a linear signal processing filter as set forth in claim 7, wherein the subband decomposition is a data compression scheme, whereby the composite subband synthesis linear operator allows for processing data directly in the compressed domain without the need for prior decompression.

9. An apparatus for combining a subband decomposition and a linear signal processing filter as set forth in claim 8, wherein the linear signal processing filter is selected from a group consisting of correlation filters, noise-reduction filters, encryption filters, and data manipulation filters; and wherein the subband decomposition is selected from a group consisting of compression filters and encryption filters.

10. A combined subband decomposition and linear signal processing filter created by the apparatus of claim 7.

11. A combined subband decomposition and linear signal processing filter created by the apparatus of claim 8.

12. A combined subband decomposition and linear signal processing filter created by the apparatus of claim 9.

13. An apparatus for combining a subband decomposition and a linear signal processing filter, where the subband decomposition comprises N-levels, with each level comprising at least two synthesis filters and an adjacent upsampler, and where each synthesis filter includes a low-pass composite filter and at least one upper-subband filter with a high-pass component, where the apparatus comprising a computer system including a processor, a memory coupled with the processor, an input coupled with the processor for receiving data, and an output coupled with the processor for outputting data, and wherein the computer system further comprises:
   (a) a module for merging the linear signal processing filter, via superposition, with each synthesis filter of the first level of the subband decomposition into a set of composite filters;
   (b) a module for generating, via an identity formulation, an equivalent structure for the low-pass composite filter and its adjacent upsampler to allow for combination of the equivalent structure with the synthesis filter on the next level of the subband decomposition;
   (c) a module for repeating the operation of the module for merging on the next level of the subband decomposition;
   (d) a module for creating, via an inverse form of the identity formulation, an equivalent structure for the intermediate structure generated by the merging step and its adjacent upsampler in order to allow for combination of the equivalent structure with the at least one synthesis filter on the next level;
   (e) a module for repeating the operation of the module for generating (b), a module for repeatedly operating (c), and the module for creating (d) for each remaining level in the subband decomposition to generate a composite subband synthesis linear operator; whereby the composite subband synthesis linear operator may be used to operate directly on the data represented by the subband decomposition.

14. An apparatus for combining a subband decomposition and a linear signal processing filter as set forth in claim 13, wherein the subband decomposition is a data compression scheme, whereby the composite subband synthesis linear operator allows for processing data directly in the compressed domain without the need for prior decompression.

15. An apparatus for combining a subband decomposition and a linear signal processing filter as set forth in claim 14, wherein the linear signal processing filter is selected from a group consisting of correlation filters, noise-reduction filters, encryption filters, and data manipulation filters; and wherein the subband decomposition is selected from a group consisting of compression filters and encryption filters.

16. A combined subband decomposition and linear signal processing filter created by the apparatus of claim 13.

17. A combined subband decomposition and linear signal processing filter created by the apparatus of claim 14.

18. A combined subband decomposition and linear signal processing filter created by the apparatus of claim 15.

19. An computer program product for combining a subband decomposition and a linear signal processing filter, where the subband decomposition comprises N-levels, with each level comprising at least two synthesis filters and an adjacent upsampler, and where each synthesis filter includes a low-pass composite filter and at least one upper-subband filter with a high-pass component, the computer program product comprising means, stored on a computer readable medium, for:
   (a) merging the linear signal processing filter, via superposition, with each synthesis filter of the first level of the subband decomposition into a set of composite filters;
   (b) generating, via an identity formulation, an equivalent structure for the low-pass composite filter and its adjacent upsampler to allow for combination of the equivalent structure with the synthesis filter on the next level of the subband decomposition;
   (c) repeating the operation of the merging means for the next level of the subband decomposition;
   (d) creating, via an inverse form of the identity formulation, an equivalent structure for the intermediate structure generated by the merging step and its adjacent upsampler in order to allow for combination of the equivalent structure with the at least one synthesis filter on the next level;
   (e) repeating the operation of the generating means (b), the repeating means (c), and the creating means (d) for each remaining level in the subband decomposition to generate a composite subband synthesis linear operator; whereby the composite subband synthesis linear operator may be used to operate directly on the data represented by the subband decomposition.

20. An computer program product for combining a subband decomposition and a linear signal processing filter as set forth in claim 19, wherein the subband decomposition is a data compression scheme, whereby the composite subband synthesis linear operator allows for processing data directly in the compressed domain without the need for prior decompression.

21. An computer program product for combining a subband decomposition and a linear signal processing filter as set forth in claim 20, wherein the linear signal processing filter is selected from a group consisting of correlation filters, noise-reduction filters, encryption filters and data manipulation filters; and wherein the subband decomposition is selected from a group consisting of compression filters and encryption filters.

* * * * *

UNITED STATES PATENT AND TRADEMARK OFFICE
CERTIFICATE OF CORRECTION

PATENT NO. : 7,046,854 B2  
APPLICATION NO. : 10/141498  
DATED : May 16, 2006  
INVENTOR(S) : Cindy Daniell Page 1 of 1

It is certified that error appears in the above-identified patent and that said Letters Patent is hereby corrected as shown below:

At column 8, lines 50-52:

"$x_1=T_1x \; x_2=T_2x_{1L}x_3=T_3x_{2L}$ and  
$x=T_1^t x_1 x_{1L}=T_2^t x_2 x_{2L}=T_3^t x_3$"  
should read:  
--$x_1=T_1x \quad x_2=T_2x_{1L} \quad x3=T_3x_{2L}$ and  
$x=T_1^t x_1 \quad x_{1L}=T_2^t x_2 \quad x_{2L}=T_3^t x_3$--

At column 14, in the equation near line 5, the outer parentheses should be removed:

" $6\left(M\left(\frac{N}{2^k}\right)\right)^2$ " should read -- $6M\left(\frac{N}{2^k}\right)^2$ --

At column 15, line 4, equation (3.8) has an incorrect superscript for "log" and missing italics on the "N"'s:  
"IFFT Computation=$N^{2\log_2}N$"  
should read:  
--IFFT Computation==$N^2 \log_2 N$--

At column 19, line 3, in equation (5.1), a comma was transcribed as a "prime" symbol:  
"$x_2=A_2x'$ and" should read --$x_2=A_2x$ , and--

Signed and Sealed this

Twenty-seventh Day of May, 2008

JON W. DUDAS  
*Director of the United States Patent and Trademark Office*